(12) United States Patent
Ishikawa et al.

(10) Patent No.: US 6,172,447 B1
(45) Date of Patent: *Jan. 9, 2001

(54) PIEZOELECTRIC TRANSFORMER DEVICE

(75) Inventors: Katsuyuki Ishikawa; Takeshi Fujimura; Masaaki Toyama; Masako Kataoka; Toru Ezaki; Takahiro Yamakawa; Yoshikazu Inoue, all of Tokyo (JP)

(73) Assignee: Taiheiyo Cement Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/214,722

(22) PCT Filed: Jul. 10, 1997

(86) PCT No.: PCT/JP97/02383

§ 371 Date: Jun. 26, 1999

§ 102(e) Date: Jun. 26, 1999

(87) PCT Pub. No.: WO98/02927

PCT Pub. Date: Jan. 22, 1998

(30) Foreign Application Priority Data

| Jul. 12, 1996 | (JP) | 8-200964 |
| Jul. 18, 1996 | (JP) | 8-206403 |
| Jul. 31, 1996 | (JP) | 8-201737 |
| Jun. 5, 1997 | (JP) | 8-148232 |

(51) Int. Cl.[7] ............................ H01L 41/08
(52) U.S. Cl. ............. 310/359; 310/363; 310/366
(58) Field of Search ............. 310/363, 366, 310/358, 359

(56) References Cited

U.S. PATENT DOCUMENTS

| 4,471,256 | * | 9/1984 | Igashira et al. | 310/328 |
| 4,523,121 | * | 6/1985 | Takahashi et al. | 310/366 X |
| 4,570,098 | * | 2/1986 | Tomita et al. | 310/346 |
| 4,742,264 | * | 5/1988 | Ogawa | 310/366 X |
| 4,759,107 | * | 7/1988 | Ogawa et al. | 310/328 X |
| 4,845,399 | * | 7/1989 | Yasuda et al. | 310/366 |
| 5,278,471 | | 1/1994 | Uehara et al. | 310/328 |
| 5,440,195 | * | 8/1995 | Ohnishi et al. | 310/359 |
| 5,736,807 | * | 4/1998 | Hakamata et al. | 310/359 |
| 5,872,419 | * | 2/1999 | Hall et al. | 310/359 |
| 5,903,086 | * | 5/1999 | Dgiso et al. | 310/359 |

FOREIGN PATENT DOCUMENTS

| 0794580A1 | | 9/1997 | (EP) . | |
| 216493 | * | 4/1986 | (JP) | 310/363 |
| 3-54878 | | 3/1991 | (JP) . | |
| 7-302938 | * | 11/1995 | (JP) | 310/359 |
| 8-69890 | * | 3/1996 | (JP) | 310/359 |
| 8-107241 | * | 4/1996 | (JP) | 310/359 |

OTHER PUBLICATIONS

Lead Zirconate Titanate Ceramics and Monolithic Piezoelectric Transformer of Low Firing Temperature; Ferroelectrics, 1990; vol. 101 pp. 193–200.

* cited by examiner

Primary Examiner—Mark O. Budd
(74) Attorney, Agent, or Firm—Burns, Doane, Swecker & Mathis, LLP

(57) ABSTRACT

In a piezoelectric transformer device (36), a plurality of inner electrodes are stacked on each other on the left side. These inner electrodes are alternately connected to each other through interlevel connection conductors to constitute two inner electrode groups. A secondary output electrode in the form of a mesh is formed near the end portion of the device (36) on the right side. Only primary input electrodes (1,2) connected to the two inner electrode groups, a secondary output electrode (40), and the lead electrode of the secondary output electrode in the form of a mesh are exposed on the same surface of the device.

18 Claims, 17 Drawing Sheets

FIG. 30

|  | Ag/Pd RATIO | THICKNESS OF INNER ELECTRODE AFTER CALCINATION (μm) | CONVERSION EFFICIENCY (%) |
|---|---|---|---|
| EXAMPLE 1 | 80 / 20 | 5 | 91 |
| EXAMPLE 2 | 70 / 30 | 1 | 92 |
| EXAMPLE 3 | 50 / 50 | 3 | 88 |
| EXAMPLE 4 | 40 / 60 | 4 | 85 |
| EXAMPLE 5 | 20 / 80 | 4 | 87 |
| COMPARATIVE EXAMPLE 1 | 50 / 50 | 7 | 72 |
| COMPARATIVE EXAMPLE 2 | 60 / 40 | 0.5 | 71 |
| COMPARATIVE EXAMPLE 3 | 80 / 20 | 8 | 70 |
| COMPARATIVE EXAMPLE 4 | 90 / 10 | 1 | 82 |
| COMPARATIVE EXAMPLE 5 | 10 / 90 | 4 | 83 |

FIG. 31

|  | Ag/Pd RATIO | THICKNESS OF INNER ELECTRODE AFTER CALCINATION (μm) | DIAMETER OF HOLE AFTER CALCINATION (μm) | CONVERSION EFFICIENCY (%) |
|---|---|---|---|---|
| EXAMPLE 6 | 80 / 20 | 5 | 100 | 90 |
| EXAMPLE 7 | 70 / 30 | 1 | 150 | 92 |
| EXAMPLE 8 | 80 / 20 | 3 | 200 | 92 |
| EXAMPLE 9 | 70 / 30 | 4 | 50 | 86 |
| EXAMPLE 10 | 50 / 50 | 2 | 180 | 88 |
| EXAMPLE 11 | 20 / 80 | 3 | 130 | 87 |
| EXAMPLE 12 | 30 / 70 | 2 | 160 | 86 |
| COMPARATIVE EXAMPLE 6 | 60 / 40 | 5 | 250 | 78 |
| COMPARATIVE EXAMPLE 7 | 10 / 90 | 3 | 150 | 83 |
| COMPARATIVE EXAMPLE 8 | 90 / 10 | 1 | 100 | 81 |
| COMPARATIVE EXAMPLE 9 | 0 / 100 | 2 | 150 | 76 |
| COMPARATIVE EXAMPLE 10 | 70 / 30 | 3 | 40 | 83 |
| COMPARATIVE EXAMPLE 11 | 50 / 50 | 8 | 300 | 69 |
| COMPARATIVE EXAMPLE 12 | 70 / 30 | 6 | 120 | 82 |
| COMPARATIVE EXAMPLE 13 | 80 / 20 | 0.5 | 200 | 75 |

PIEZOELECTRIC TRANSFORMER DEVICE

BACKGROUND OF THE INVENTION

The present invention relates to a piezoelectric transformer device, e.g., a Rosen type piezoelectric transformer device having a multilayer structure.

Recently, liquid crystal display panels have been widely used as display units in notebook personal computers which are easy to carry. Such a liquid crystal display panel incorporates a cold cathode tube serving as a backlight for backlighting the panel. In order to light this cold cathode tube, a high voltage of about 1 kV or more is required. To maintain emission of light, a voltage of about several hundred volts must be applied.

In such notebook personal computers and similar products, owing to their characteristics, the demand for compact, small-power-consumption boosting modules for backlights is high. In order to meet this demand, a so-called Rosen type piezoelectric transformer device having a single-plate structure is used. According to a power supply module using a piezoelectric transformer device having a single-plate structure, reductions in size and weight of the module can be attained as compared with a winding transformer having a similar output capacity.

However, in a piezoelectric transformer device having a single-plate structure having, for example, a length of about 30 mm, a width of about 3 mm, and a thickness of about 2 mm, the boosting ratio (the ratio of the output voltage to the input voltage) is about 4 to 6 at a heavy load, e.g., a 2-W output. That is, a desired boosting ratio cannot be obtained. For this reason, a compact winding transformer must be connected to the input stage of the piezoelectric transformer device.

In recent years, piezoelectric transformer devices having multilayer structures which attain large boosting ratios have been proposed in, for example, Japanese Patent Laid-Open Nos. 4-338685, 7-79027, and 7-131088. Such a piezoelectric transformer device having a multilayer structure is equivalent to a plurality of piezoelectric transformer devices having single-plate structures which are connected in parallel with each other, and is designed to obtain a high boosting ratio. For example, this device has an input region in which ceramic piezoelectric members and inner electrodes, each having a thickness of about 50 to 300 µm, are alternately stacked on each other. These stacked inner electrodes are alternately and electrically connected to each other to constitute two inner electrode groups electrically insulated from each other. These two inner electrode groups are electrically connected to two outer electrodes formed on the upper and lower surfaces of the input region (Japanese Patent Laid-Open No. 7-302938).

FIGS. 1 to 5 show an example of the structure of a piezoelectric transformer device having a multilayer structure.

FIG. 1 is a perspective view showing a piezoelectric transformer device having a general multilayer structure. FIG. 2 is a front view of the piezoelectric transformer device in FIG. 1. FIG. 4 is a plan view of the piezoelectric transformer device in FIG. 1.

This piezoelectric transformer device has an outer shape like the one shown in FIGS. 1, 2, and 4. The right and left half regions of the device will be respectively referred to as the second and first regions hereinafter.

Outer electrodes 101 and 102 as primary (input) electrodes are formed on the upper and lower surfaces of the first region. A plurality of inner electrodes 101a and 102a are alternately stacked between the outer electrodes 101 and 102, and the spaces between these inner electrodes are filled with a piezoelectric element 106. An outer electrode 103 as a secondary (output) electrode is formed on the right end portion of the second region. Lead wires 105 are connected to the outer electrodes 101, 102, and 103 with solder portions 104.

The internal structure of the first region will be described next. FIG. 3 is a sectional view taken along a line A–A' of the piezoelectric transformer device in FIG. 2. FIG. 5 is a sectional view taken along a line B–B' of the piezoelectric transformer device in FIG. 1.

As shown in FIGS. 3 and 5, in the first region, the plurality of inner electrodes 101a are connected to each other through a columnar conductor (to be referred to as an interlevel connection conductor hereinafter) 107a, and the plurality of inner electrodes 102a are connected to each other through an interlevel connection conductor 107b. Circular holes (to be referred to as holes hereinafter) are formed in the inner electrodes 101a and 102a so that the inner electrodes 101a and 102a are not connected to each other through the interlevel connection conductors 107a and 107b.

The piezoelectric transformer device having the above multilayer structure is driven as follows. First of all, a high voltage is applied between the outer electrodes 101 and 102 to polarize the first region in the vertical direction (thickness direction). A predetermined voltage is then applied between the outer electrode 101 or 102 and the outer electrode 103 to polarize the second region in the longitudinal direction. When an AC voltage is applied between the outer electrodes 101 and 102 of the device in the polarized state, the piezoelectric element 106 in the first region mechanically vibrates in accordance with the piezoelectric material constant unique to the piezoelectric element, the resonance characteristics, and the dimensions of the overall device. The vibrations are converted into a voltage by the piezoelectric element 106 in the second region. As a result, a boosted high AC voltage can be extracted from the outer electrode 103.

When the present inventors manufactured a multilayer type piezoelectric transformer device having a length of 30 mm, a width of 3 mm, and a thickness of 2 mm by stacking 25 piezoelectric members each having a thickness of about 80 µm, and conducted a test on the device, a very high boosting ratio, about 80, was obtained at 2-W output.

In the piezoelectric transformer device having the above structure, however, since a plurality of inner electrodes are exposed on the side surfaces of the piezoelectric transformer device, electric discharges may occur between the inner electrodes exposed on the side surfaces to cause breakdown, resulting in imperfect polarization, especially when the piezoelectric transformer device is polarized in the air. For this reason, the present inventors has proposed a piezoelectric transformer device having the following multilayer structure in Japanese Patent Application No. 8-52553. In this structure, the inner electrodes are not exposed on the side surfaces of the device, and holes formed in advance in the piezoelectric members at the positions where the inner electrodes are to be stacked are filled with conductors so as to electrically connect the inner electrodes to each other.

In the conventional piezoelectric transformer device shown in FIG. 1, however, the outer electrodes to which the lead wires 105 are to be soldered are formed on the three surfaces, i.e., the upper surface, lower surface, and longitudinal end face of the device. That is, the outer electrodes are not in the same plane. For this reason, in an automatic assembly process using industrial robots, the soldering step and the like are complicated.

In addition, the above conventional piezoelectric transformer device has the structure in which the inner electrodes an the outer electrodes are exposed on the surfaces of the device. For this reason, the piezoelectric transformer device must be housed in a case (not shown) consisting of, e.g., an insulating material, similar to a piezoelectric transformer device having a single-plate structure, in consideration of safety. A case much larger than the piezoelectric transformer device having such a structure is required to house the device in consideration of the volume of the connecting portion of the device. The manufacturing step of housing the device in the case itself complicates the automatic assembly process.

Further, in order to extract a boosted high AC voltage from the piezoelectric element 106 having the multilayer structure, the outer electrode 101 or 102 and the outer electrode 103 are used. Unlike a general winding transformer, therefore, the outer electrode 101 or 102 is used as a common electrode shared by the primary (input) and secondary (output) sides. For this reason, the piezoelectric transformer device having the multilayer structure described above cannot be use for a circuit that demands electric insulation between the primary and secondary sides.

Furthermore, the conversion efficiency of the piezoelectric transformer device having the multilayer structure, i.e., the value obtained by dividing the output power by the input power, is 70 to 80%, which is lower than the conversion efficiency (90% or more) of the piezoelectric transformer device having the single-plate structure.

In a FERROELECTRICS, 1990, UK, vol.101, ISSN0015-0193, pages 193–200, a monolithic piezoelectric transformer device using PZT-G ceramics is disclosed. In the document, the transformer device comprises a primary side (driving section) in which ceramic piezoelectric sheets and internal electrodes for poling and operating are alternately stacked on each other and sintered at about 960° C. In the primary side of the transformerdevice, alloy of Ag/Pd=80/20 is used as internal electrodes.

In a PATENT ABSTRACTS OF JAPAN, vol. 015, no. 200 (E-1070), May 22, 1991 & JP-A-03 054878, a piezoelectric transformer device having external electrodes with pairs of high and low impedance parts is disclosed. In the transformer device, the external electrodes are connected to every two electrode layers which are laminated alternately, with piezoelectric layers. Alloy of Ag—Pg is used in internal electrodes of the transformer device.

U.S. Pat. No. 5,278,471 discloses a piezoelectric ceramic transformer including a high impedance portion which has internal electrode layers which are opposite each other in a thickness direction in a radial central portion of a piezoelectric ceramic disk. In the ceramic transformer, alloy of Ag—Pg is also used in the internal electrode layers of the transformer.

In a PATENT ABSTRACTS OF JAPAN, vol. 096, no. 007, Jul. 31, 1996 & JP-A-08 069890, Mar. 12, 1996, a multilayer piezoelectric transformer comprising alternately layered piezoelectric bodies is disclosed. In the transformer, input external electrodes are respectively connected to layered input internal electrodes.

SUMMARY OF THE INVENTION

It is, therefore, an object of the present invention to provide a piezoelectric transformer device which ensures safety, is easy to handle, and exhibits good performance as a transformer.

It is another object of the present invention to provide piezoelectric transformer device which has good conversion efficiency.

It is still another object of the present invention to provide a piezoelectric transformer device which is suitable for an automatic manufacturing process in terms of handling.

It is still another object of the present invention to provide a piezoelectric transformer device having primary and secondary sides electrically insulated from each other and exhibiting good transforming performance.

In order to achieve the above objects, the piezoelectric transformer device are characterized by the following arrangements.

There is provided a piezoelectric transformer device having an input region in which inner electrodes, which essentially consist of an Ag—Pd mixture containing 20 to 80 wt % of Pd, and ceramic piezoelectric members are alternately stacked on each other, each of said inner electrodes has a thickness of 1 to 5 $\mu$m. With this arrangement, attenuation of the vibrations of the piezoelectric members due to the inner electrodes is suppressed, thus obtaining good conversion efficiency.

For example, it is preferable that the plurality of inner electrodes be included in the piezoelectric transformer device, and connected to each other through at least two columnar conductors included in the piezoelectric transformer device, and the columnar conductor essentially consist of an Ag—Pd mixture containing 20 to 80 wt % of Pd, and have a diameter of not more than 200 $\mu$m. With this arrangement, attenuation of the vibrations of the piezoelectric members and the columnar conductors due to the inner electrodes is suppressed, thus obtaining good conversion efficiency.

In addition, in order to achieve the above objects, the piezoelectric transformer device of the present invention is characterized by the following arrangements.

There is provided a piezoelectric transformer device having a first region polarized in a thickness direction and having primary electrodes formed therein, a second region polarized in a longitudinal direction and having secondary electrodes formed therein, and a plurality of piezoelectric members stacked on each other, comprising a plurality of first inner electrodes arranged as the primary electrodes between the plurality of piezoelectric members and included in the first region, a plurality of second inner electrodes arranged as the secondary electrodes between the plurality of piezoelectric members and included in the second region, a first outer electrode formed on a surface of the piezoelectric transformer device to apply a voltage to the plurality of first inner electrodes, and a second outer electrode formed on a surface of the piezoelectric transformer device to extract a voltage generated in the piezoelectric transformer device upon application of the voltage through the plurality of second inner electrodes. With this arrangement, the metal portions exposed on the surface of the device can be minimized.

For example, the first and second outer electrodes are formed on the same plane of the piezoelectric transformer device. With this arrangement, connection to external members is facilitated.

For example, the device is characterized in that the plurality of second inner electrodes are connected to each other in the form of a mesh through a plurality of columnar conductors included in the second region. With this arrangement, secondary electrodes are formed in the piezoelectric transformer device having the multilayer structure.

Preferably, the plurality of first inner electrodes are alternately connected to each other through at least two columnar conductors included in the first region, thereby constituting two inner electrode groups.

More preferably, the device comprises a third outer electrode insulated from the first and second inner electrodes and the first and second outer electrodes and formed as another electrode of the secondary electrodes on the plane of the first region. With this arrangement, the primary and secondary sides are insulated from each other to obtain good performance as a transformer.

In the device having the above arrangements, it is preferable that the first outer electrode and/or the third outer electrode be formed at the position corresponding to a node of the driving vibration mode of the piezoelectric transformer device, and the two columnar conductors be formed at the position corresponding to the node of the driving vibration mode of the piezoelectric transformer device so as to prevent attenuation of the vibrations of the device.

Furthermore, in order to achieve the above objects, the piezoelectric transformer device of the present invention is characterized by the following arrangement.

There is provided a piezoelectric transformer device having a first region polarized in a thickness direction and having primary electrodes formed therein, a second region polarized in a longitudinal direction and having secondary electrodes formed therein, and a plurality of piezoelectric members stacked on each other, comprising a plurality of inner electrodes arranged as the primary electrodes between the plurality of piezoelectric members in the first region, a plurality of first outer electrodes formed on a surface of the piezoelectric transformer device to apply a voltage to the plurality of inner electrodes, a second outer electrode formed as the secondary electrode on an end portion of the second region, and a third outer electrode insulated from the plurality of inner electrodes and the first and second outer electrodes and formed as another electrode of the secondary electrodes on a surface of the first region of the piezoelectric transformer device on which the first outer electrode is formed. With this arrangement, the primary and secondary sides are insulated from each other to obtain good performance as a transformer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 30 is a table showing data about Examples of the fourth embodiment of the present invention and Comparative Examples; and FIG. 31 is a table showing data about Examples of the fourth embodiment of the present invention and Comparative Examples.

DETAILED DESCRIPTION OF THE PREFERRED EMBODIMENT

Piezoelectric transformer device having multilayer structures according to the embodiments of the present invention will be described below with reference to the accompanying drawings.

In each embodiment which will be described hereinafer, the piezoelectric transformer device is driven in the λ mode. However, the present invention is not limited to the λ mode. As is apparent, for example, the piezoelectric transformer device may be driven in the λ/2 and 3/2λ modes. As is apparent, the number of inner electrodes of a piezoelectric transformer device of the present invention is not limited to the one in the accompanying drawings; the inner electrodes are drawn as they are for the sake of illustrative convenience.

First Embodiment

The first embodiment of the present invention will be described first with reference to FIGS. 6 to 12.

Figure 6:
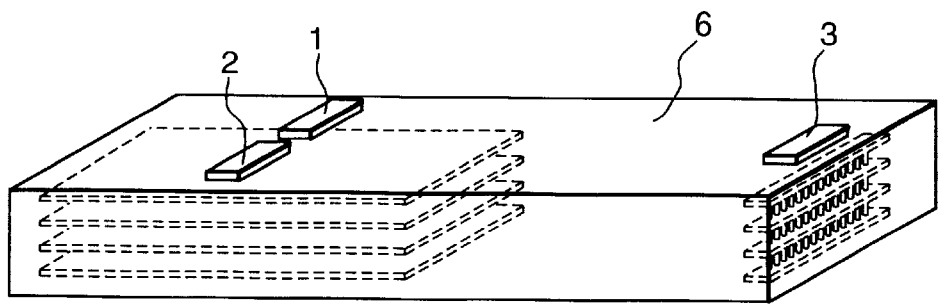
FIG. 6 is a perspective view showing a piezoelectric transformer device having a multilayer structure according to the first embodiment of the present invention.
Figure 7:
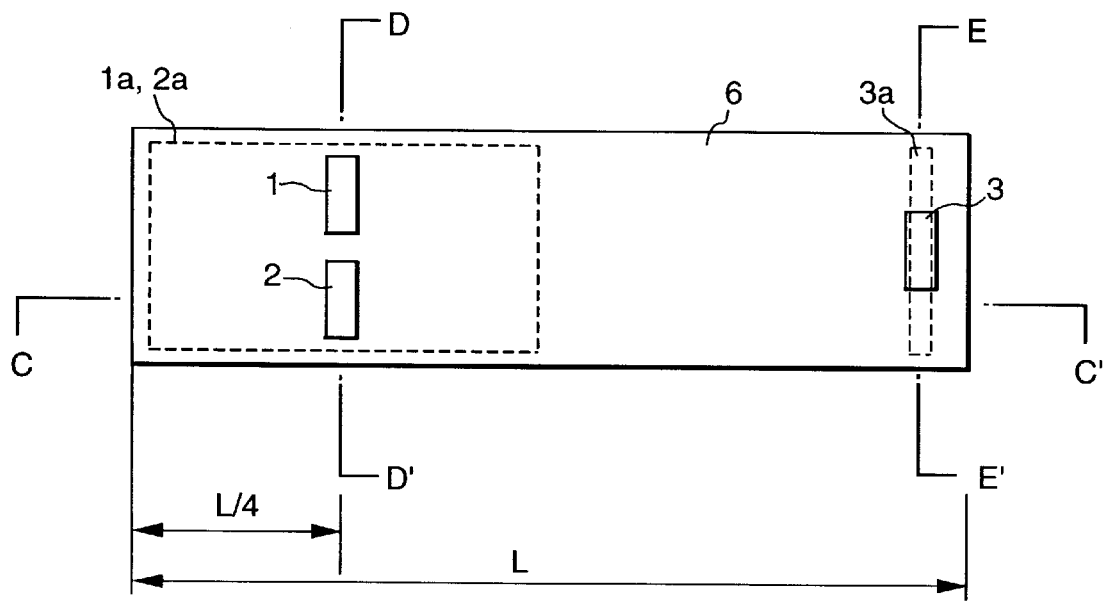
FIG. 7 is a plan view of the piezoelectric transformer device according to the first embodiment of the present invention in FIG. 6.

FIG. 6 is a perspective view showing a piezoelectric transformer device having a multilayer structure according to the first embodiment of the present invention. FIG. 7 is a plan view of the piezoelectric transformer device in FIG. 6.

The piezoelectric transformer device of this embodiment has an outer shape like the one shown in FIGS. 6 and 7. The right and left halves of this structure will be respectively referred to as the second and first regions hereinafter. Outer electrodes 1 and 2 as primary (input) electrodes are formed on the upper surface of the first region of a piezoelectric element 6. An outer electrode 3 as a secondary output lead electrode is formed on the upper surface of the second region. That is, according to the piezoelectric transformer device of this embodiment, only these outer electrodes are exposed and formed on the same surface, and the following inner electrodes and the like are included in the piezoelectric element 6.

Figure 8:
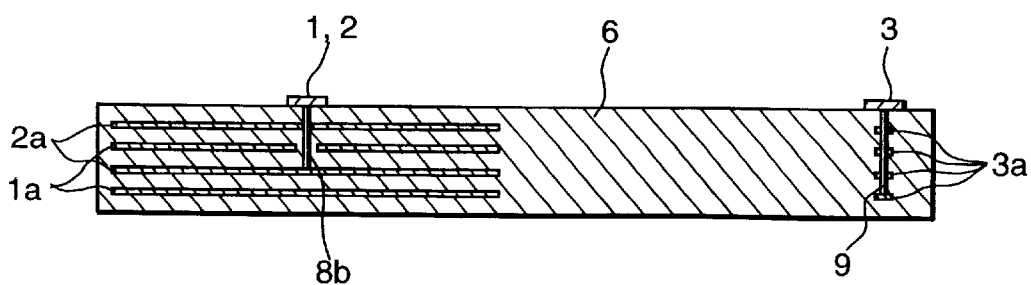
FIG. 8 is a sectional view taken along a line C–C' of the piezoelectric transformer device according to the first embodiment of the present invention in FIG. 7.
Figure 9:
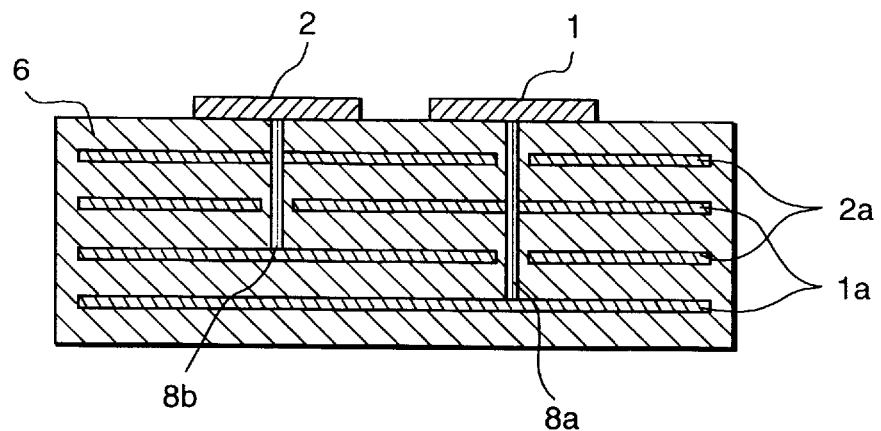
FIG. 9 is a sectional view taken along a line D–D' of the piezoelectric transformer device according to the first embodiment of the present invention in FIG. 7.
Figure 10:
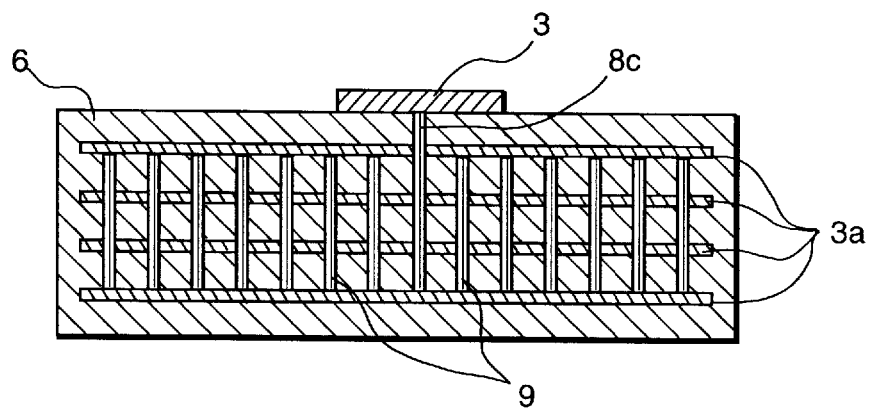
FIG. 10 is a sectional view taken along a line E–E' of the piezoelectric transformer device according to the first embodiment of the present invention in FIG. 7.

The internal structure of the piezoelectric transformer device of this embodiment will be described next. FIG. 8 is a sectional view taken along a line C–C' of the piezoelectric transformer device in FIG. 7. FIG. 9 is a sectional view taken along a line D–D' of the piezoelectric transformer device in FIG. 7. FIG. 10 is a sectional view taken along a line E–E' of the piezoelectric transformer device in FIG. 7.

As shown in FIGS. 8 and 9, a plurality of inner electrodes 1a and 2a are alternately stacked inside the first region, and the spaces between the inner electrodes are filled with the piezoelectric element 6. A circular hole (to be simply referred to as a hole hereinafter) is formed around a columnar conductor (to be referred to as an interlevel connection conductor hereinafter) 8b (8a) inserted in the inner electrode 1a (2a), so that the inner electrodes 1a and 2a are not connected to each other through the interlevel connection conductors 8a and 8b (this structure will be described in detail later). As is apparent, each hole need not always have a circular shape.

The plurality of inner electrodes 1a are connected to each other through the interlevel connection conductor 8a. The interlevel connection conductor 8a extends toward the upper surface of the first region and is connected to the outer electrode 1.

Similarly, the plurality of inner electrodes 2a are connected to each other through the interlevel connection conductor 8b. The interlevel connection conductor 8b also extends toward the upper surface of the first region and is connected to the outer electrode 2.

As shown in FIGS. 8 and 10, a plurality of inner electrodes 3a are stacked inside the second region at a position near the longitudinal end portion, and the spaces between the inner electrodes are filled with the piezoelectric element 6. The plurality of inner electrodes 3a are connected to each other through an interlevel connection conductor 8c and a plurality of interlevel connection conductors 9 in the form of a mesh. The interlevel connection conductor 8c extends toward the upper surface of the second region and is connected to the outer electrode 3. That is, in this embodiment, the secondary (output) electrode of the piezoelectric transformer device is constituted by the inner electrodes 3a, the interlevel connection conductor 8c, and the interlevel connection conductors 9 which are connected in the form of a mesh. A boosted high AC voltage is extracted through the outer electrode 3 as the lead electrode.

Figure 1:
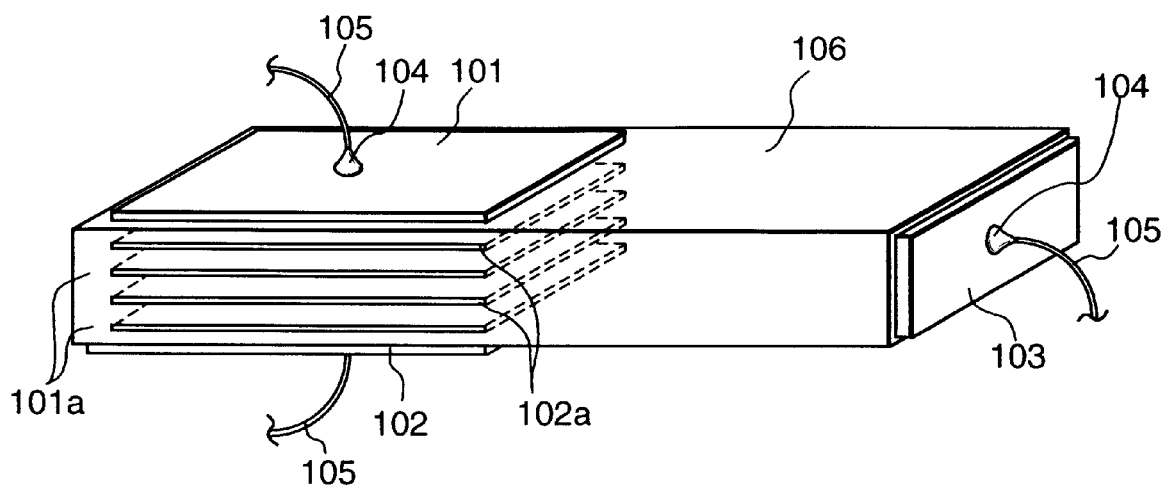
FIG. 1 is a perspective view showing a piezoelectric transformer device having a general multilayer structure.
Figure 2:
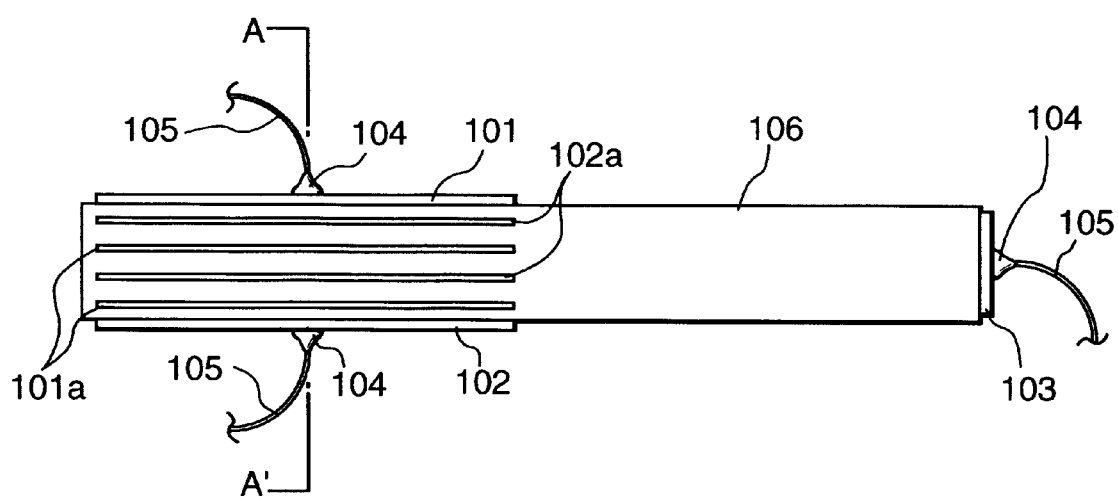
FIG. 2 is a front view of the piezoelectric transformer device in FIG. 1.
Figure 3:
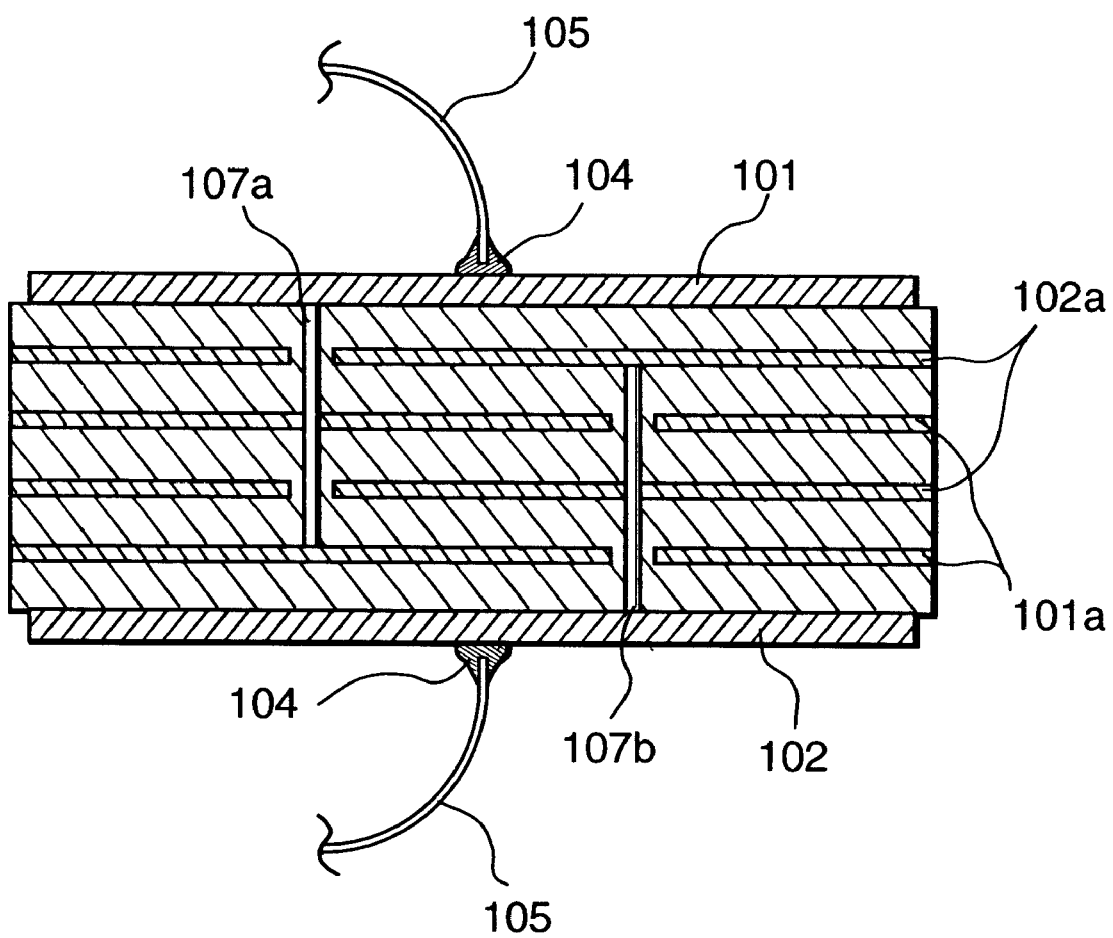
FIG. 3 is a sectional view taken along a line A–A' of the piezoelectric transformer device in FIG. 1.
Figure 4:
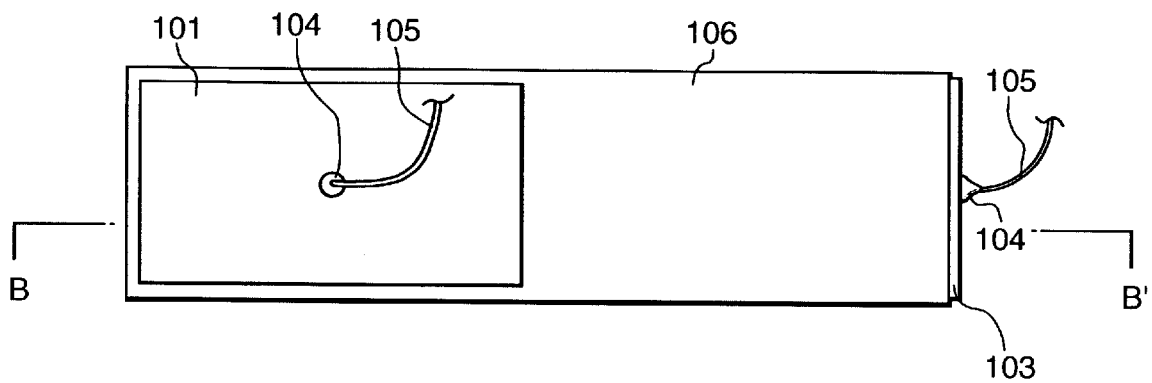
FIG. 4 is a plan view of the piezoelectric transformer device in FIG. 1.
Figure 5:
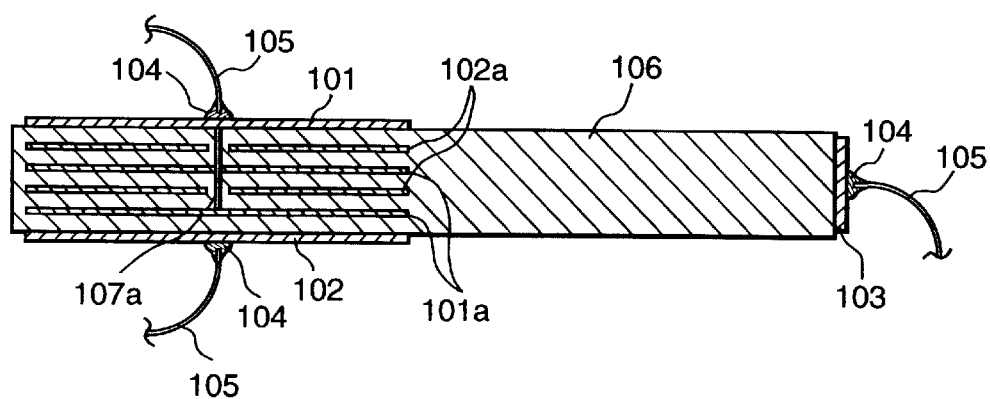
FIG. 5 is a sectional view taken along a line B–B' of the piezoelectric transformer device in FIG. 1.

The secondary electrode of this device will be described below. The piezoelectric transformer device of this embodiment has the multilayer structure to be described later with reference to FIG. 12. For this reason, the output electrode cannot be formed into a plate-like electrode like the outer electrode 103 in FIG. 1 owing to the manufacture method for this device. If, however, the mesh constituted by the inner electrodes 3a, the interlevel connection conductor 8a and the interlevel connection conductors 9 in the device is formed to have a cross-sectional area 5% or more larger than that of this device in the widthwise direction, the electrode satisfactorily serves as an output electrode.

The positions where the outer electrodes 1 and 2 are formed will be described next. When an input voltage is to be boosted by the piezoelectric transformer device, the positions of terminals for connecting the lead wires of the input and output electrodes need not be specifically limited. Theoretically, however, the position corresponding to a node of the mechanical vibrations of the device becomes a fixed point. If the terminals for connecting the lead wires of the input and output electrodes are formed at the position corresponding to a node of vibrations, peeling, removal, and the like of the lead wires or the device itself due to vibrations can be prevented, and attenuation of the vibrations can also be prevented. More specifically, the positions corresponding to ¼ the length of the device from the respective longitudinal end portions become fixed points. In this embodiment, therefore, when the piezoelectric element 6 has a length L in the longitudinal direction, the centers of the outer electrodes 1 and 2 and the centers of the interlevel connection conductors 8a and 8b are located at the position corresponding to L/4 from the end portion of the first region, i.e., the position corresponding to a node of the driving vibration mode of the piezoelectric transformer device.

According to a drive test conducted by the present inventors after polarization processing of this device, the device exhibited performance comparable with that of a conventional device.

The structure of the piezoelectric transformer device of this embodiment and the steps in manufacturing the same will be described next with reference to FIGS. 12 and 13A to 13D.

Figure 12:
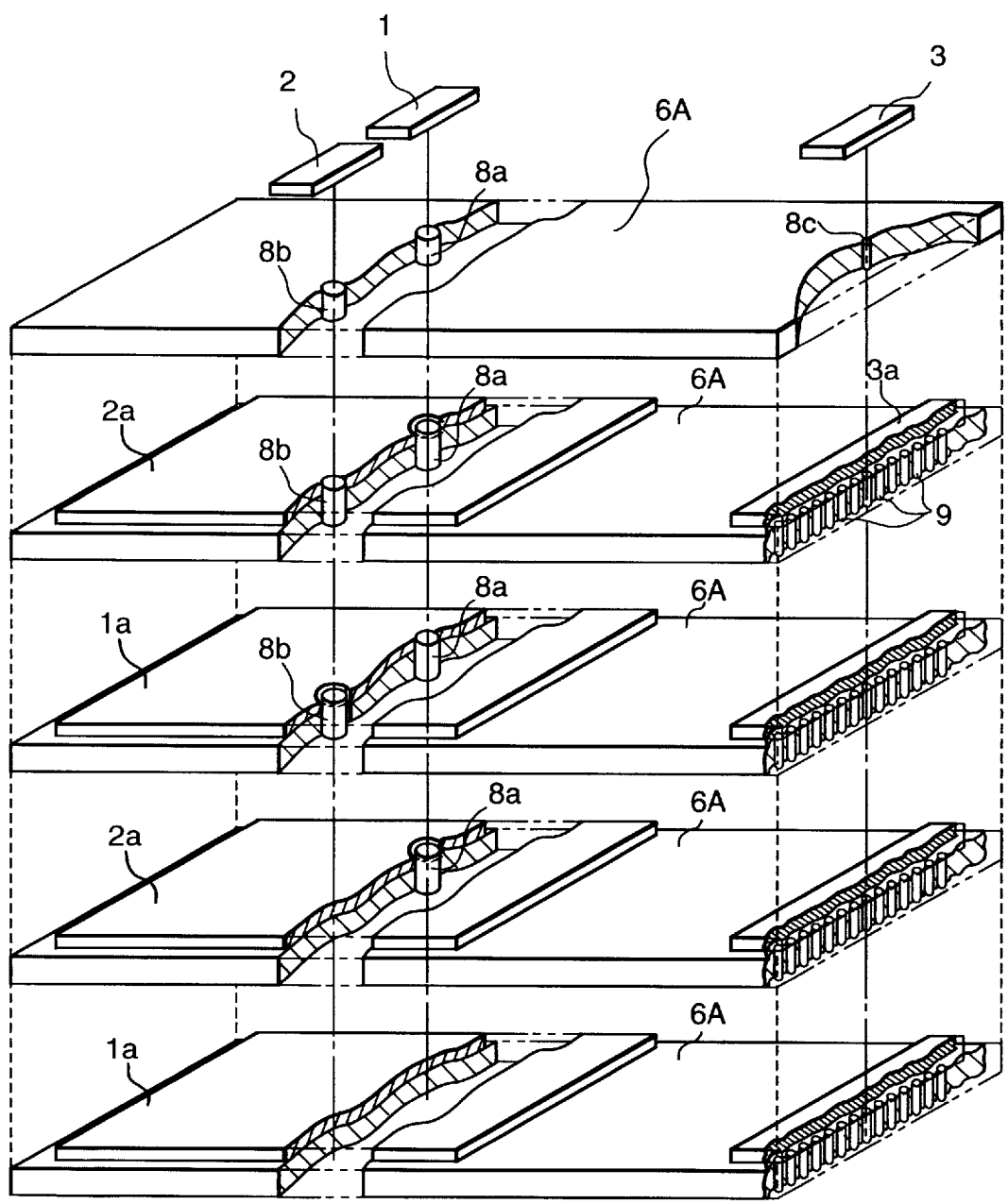
FIG. 12 is a perspective view showing the multilayer structure of the piezoelectric transformer device according to the first embodiment of the present invention.

FIG. 12 shows the multilayer structure of the piezoelectric transformer device according to the first embodiment of the present invention. FIGS. 13A to 13D explain the steps in manufacturing the piezoelectric transformer device according to the first embodiment of the present invention. Each of FIGS. 13A to 13D is a sectional view of the interlevel connection conductor portion of a piezoelectric ceramic tape (to be referred to as a tape hereinafter) 6A, taken along the widthwise direction. The steps in manufacturing the piezoelectric transformer device in FIG. 12 will be described below.

1) Each tape 6A is formed in advance as follows. A Pb (Zr, Ti)-$O_3$-based piezoelectric material powder is mixed with water and a binder to prepare a slurry by using a ball mill. Tapes are then formed from this slurry by the doctor blade method.

2) Through holes are formed in the respective tapes 6A at the positions corresponding to the interlevel connection conductors (8a, 8b, 8c, 9) when the tapes are stacked. Note that the holes for the interlevel connection conductors 8a and 8b have the same diameter, and the holes for the interlevel connection conductor 8c have the same diameter.

3) The holes in the tapes 6A are filled with an Ag—Pd paste serving as the interlevel connection conductors (in this case, the amount of filling plate is set such that each paste portion properly protrudes in a convex form from the surface of each tape 6A).

4) The inner electrode 1a or 2a is printed on the upper surface of each tape 6A at the position (left side in FIG. 12) corresponding to the first region in the stacked state, and the inner electrode 3a is printed at the position (right side in FIG. 12) corresponding to the end portion of the second region in the stacked state. These inner electrodes are formed from an Ag—Pd paste. In this embodiment, as is apparent, in order to realize the included structure for the respective inner electrodes, which is a characteristic feature of the piezoelectric transformer device of this embodiment, the sizes of the inner electrodes 1a, 2a, and 3a formed on each tape 6A are set such that their edge portions are located inside the edge portion of the tape 6A.

Figure 13A:
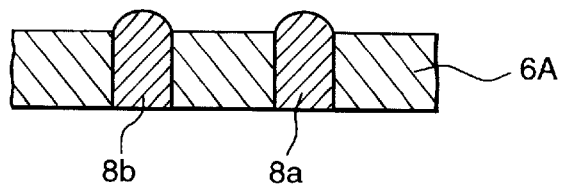
FIG. 13A is a sectional view for explaining a manufacturing process for the piezoelectric transformer device according to the first embodiment of the present invention.
Figure 13B:
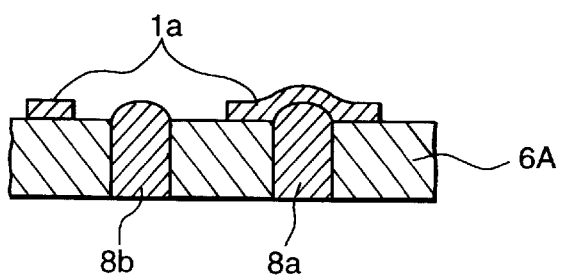
FIG. 13B is a sectional view for explaining the manufacturing process for the piezoelectric transformer device according to the first embodiment of the present invention.
Figure 13C:
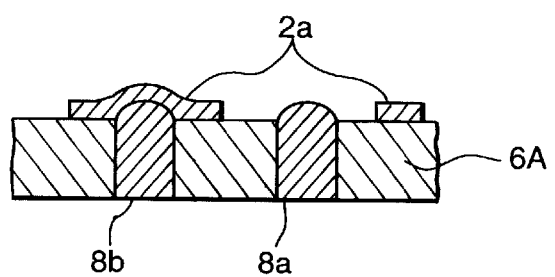
FIG. 13C is a sectional view for explaining the manufacturing process for the piezoelectric transformer device according to the first embodiment of the present invention.

The shapes of the inner electrodes 1a and 2a will be described below. The inner electrodes 1a and 2a are shaped such that holes larger in diameter than the two interlevel connection conductors on the primary side which fill the holes in the tapes 6A are formed in the electrodes depending on whether they are connected to the interlevel connection conductors. More specifically, when a given inner electrode is printed on the tape 6A having the holes filled with the interlevel connection conductors, a hole larger in diameter than the interlevel connection conductors is formed in the inner electrode at the position corresponding to the upper portion of one of the interlevel connection conductors which is not connected to the inner electrode. No hole is formed in the inner electrode at the position corresponding to the upper portion of the other interlevel connection conductor which is connected to the inner electrode. FIGS. 13B and 13C show this state.

Figure 13D:
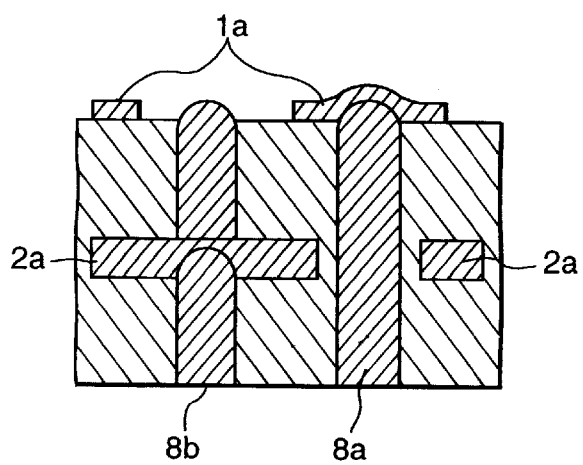
FIG. 13D is a sectional view for explaining the manufacturing process for the piezoelectric transformer device according to the first embodiment of the present invention.

5) A desired number of tapes 6A having undergone the above process are stacked on each other. For example, FIG. 13D shows the stacked state of the tapes 6A in FIGS. 13B and 13C. In practice, a plurality of tapes are stacked on the upper and lower surfaces of this structure shown in FIG. 13D.

The tape 6A obtained in steps 1) to 3) described above is stacked on the uppermost layer of the multilayer structure constituted by the tapes 6A. The tape 6A on which the inner electrode 2a which is not connected to the interlevel connection conductor 8a is printed, together with the inner electrode 3a, is stacked like the second tape 6A from the bottom in FIG. 12. Furthermore, the tape 6A on which the inner electrodes 1a and 3a having no holes are printed, like the lowermost tape 6A in FIG. 12, is stacked on the lower surface of the resultant structure.

6) The tapes 6A obtained in step 5) are then subjected to thermocompression bonding and calcined at 1,150° C. As shown in FIGS. 13B and 13C, cavities are formed around the protruding interlevel connection conductors at the portions of the inner electrodes in which the holes are formed. However, since the cavities are filled with the piezoelectric members of the tapes 6A stacked on the interlevel connection conductors when the tapes are stacked on each other by thermocompression bonding, the cavities are eliminated.

7) The outer electrodes 1, 2, and 3 formed from an Ag paste are printed on the upper surface of the calcined structure obtained by calcination, and baked at 700° C. With this process, the outer electrodes 1 and 2 are connected to the inner electrodes 1a and 2a stacked below through the interlevel connection conductors 8a or 8b filling the holes in the tapes 6A. Similarly, the outer electrode 3 is connected to the inner electrodes 3a stacked below and the interlevel connection conductors 9 through the interlevel connection conductor 8c filling the holes in the tapes 6A.

8) The piezoelectric transformer device of this embodiment is obtained by polarizing the piezoelectric transformer device obtained in the above steps.

As described above, according to the piezoelectric transformer device of this embodiment, the structure in which only the outer electrodes 1, 2, and 3 are exposed on the same surface of the device can be realized, as well as the included structure for the respective inner electrodes which is disclosed in Japanese Patent Application No. 8-52553. In addition, since these outer electrodes serve as terminals used for inputting/outputting voltages, unlike the outer electrodes of the conventional piezoelectric transformer device (FIG. 1), each lead wire can be reduced in area to such an extent that soldering can be performed. Basically, therefore, this structure need not be housed in a case and hence is easy to handle as long as some consideration is given to contact between the respective outer electrodes and the surroundings in actual use.

In addition, the piezoelectric transformer device of this embodiment has the respective outer electrodes arranged on the same surface. For this reason, in the process of manufacturing a power supply module or the like using this device, the device can be directly mounted on a printed board or the like without the mediacy of lead wires to the respective outer electrodes. This prevents an electric shock due to a careless touch. In addition, the size of the product-using the device can be reduced, and the manufacturing process can be simplified, facilitating automation of assembly.

Figure 11:
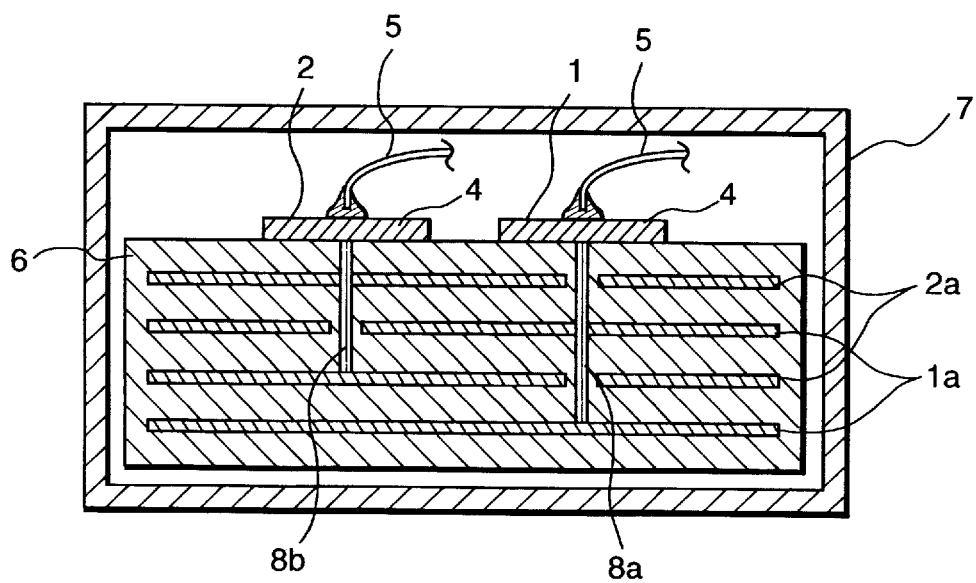
FIG. 11 is a sectional view showing the piezoelectric transformer device according to the first embodiment of the present invention which is housed in a case.

FIG. 11 is a sectional view showing the piezoelectric transformer device according to the first embodiment of the present invention which is housed in a case. This sectional view is taken at the same position as that of FIG. 9. As shown in FIG. 11, when the piezoelectric transformer device is housed in a case 7, lead wires 5 and solder portions 4 are not present on the lower side of the device. Although not shown, the outer electrode 3 is also present in the same plane as that of the outer electrodes 1 and 2. Unlike, for example, the conventional piezoelectric transformer device (FIG. 1), therefore, the thickness and length of the case can be reduced.

Second Embodiment

The second embodiment of the present invention will be described next with reference to FIGS. 14 to 17.

Figure 14:
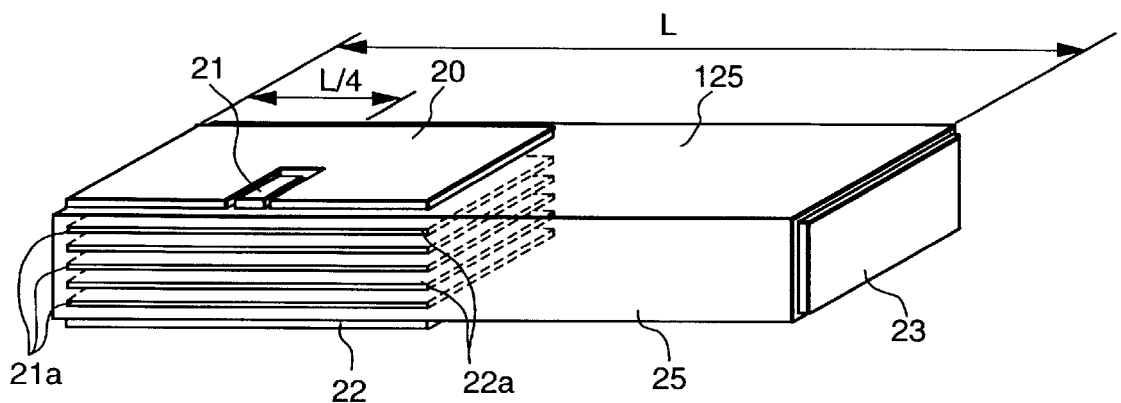
FIG. 14 is a perspective view showing a piezoelectric transformer device having a multilayer structure according to the second embodiment of the present invention.
Figure 15:
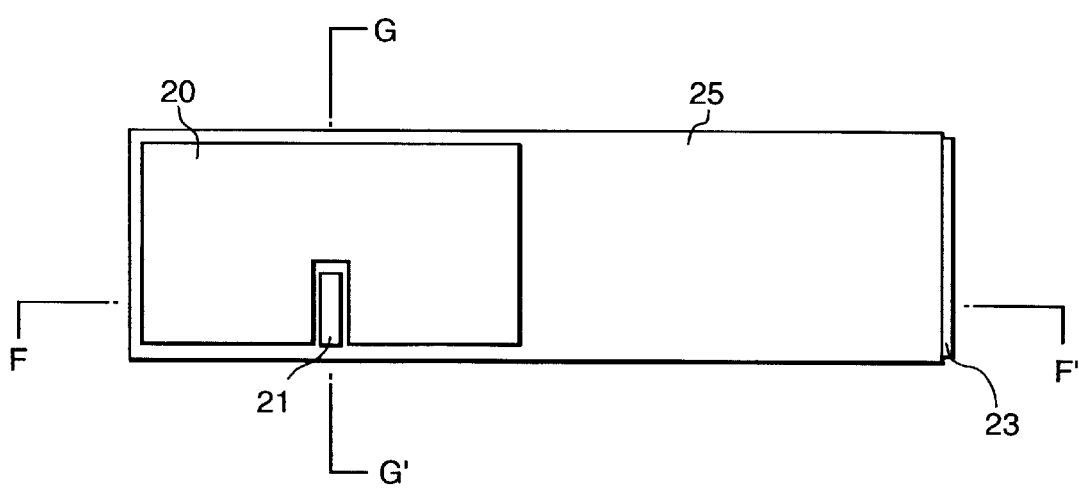
FIG. 15 is a plan view of the piezoelectric transformer device according to the second embodiment of the present invention in FIG. 14.

FIG. 14 is a perspective view showing a piezoelectric transformer device having a multilayer structure according to the second embodiment of the present invention. FIG. 15 is a plan view of the piezoelectric transformer device in FIG. 14.

The piezoelectric transformer device of this embodiment has an outer shape like the one shown in FIGS. 14 and 15. The right and left halves of this structure will be respectively referred to as the second and first regions hereinafter. An outer electrode 21 as a primary electrode and an outer electrode 20 as a secondary electrode are formed on the upper surface of the first region of a piezoelectric element 25. An outer electrode 22 as a primary electrode is formed on the lower surface of the first region. An outer electrode 23 as a secondary electrode is formed on an end portion of the second region.

Since the outer electrode 20 is used together with the outer electrode 23 as a secondary electrode, the shape and area of the outer electrode 20 need not be specifically limited. In this embodiment, the outer electrode 20 is on the entire surface of the first region in consideration of the resistance of the electrode with respect to a current flowing therein.

Figure 16:
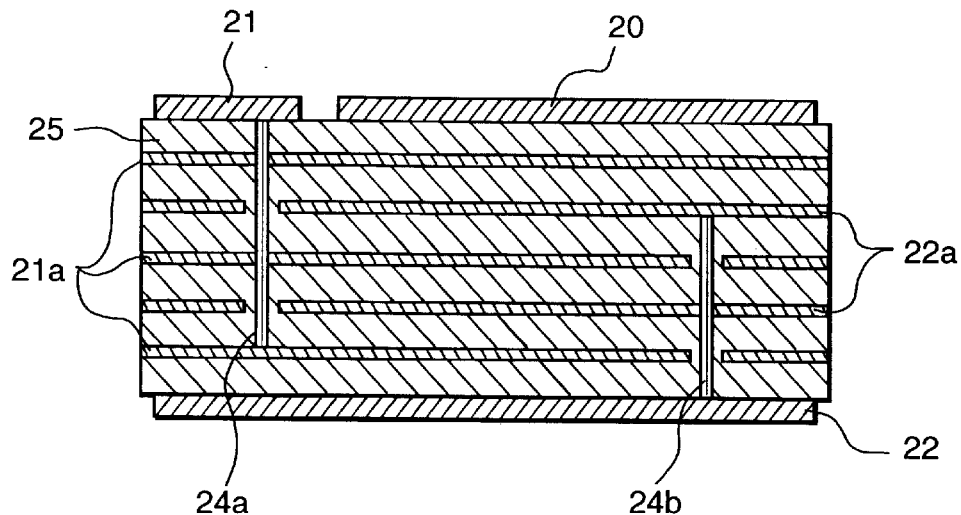
FIG. 16 is a sectional view taken along a line G–G' of the piezoelectric transformer device according to the second embodiment of the present invention in FIG. 15.
Figure 17:
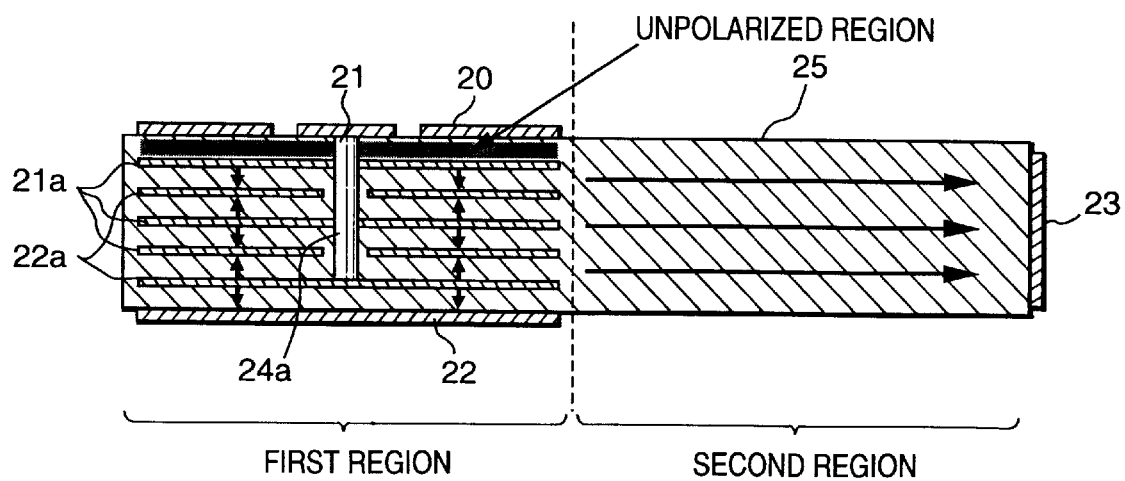
FIG. 17 is a sectional view taken along a line F–F' of the piezoelectric transformer device according to the second embodiment of the present invention in FIG. 15.

The internal structure of the piezoelectric transformer device of this embodiment will be described next. FIG. 16 is a sectional view taken along a line G–G' of the piezoelectric transformer device in FIG. 15. FIG. 17 is a sectional view taken along a line F–F' of the piezoelectric transformer device in FIG. 15. FIG. 17 also shows the directions of polarization of the piezoelectric element at a given time point.

As shown in FIGS. 16 and 17, a plurality of inner electrodes 21a and 22a are alternately stacked inside the first region, and the spaces between the inner electrodes are filled with the piezoelectric element 25. Note that circular holes are formed in the inner electrodes 21a and 22a, as in the first embodiment, and hence the inner electrodes 21a and 22a are not connected to each other through interlevel connection conductors 24a and 24b.

The plurality of inner electrodes 21a are connected to each other through the interlevel connection conductor 24a. The interlevel connection conductor 24a extends toward the upper surface of the first region and is connected to the outer electrode 21. Similarly, the plurality of inner electrodes 22a are connected to each other through the interlevel connection conductor 24b. The interlevel connection conductor 24b extends toward the lower surface of the first region and is connected to the outer electrode 22. With this structure, even when a voltage is applied between the outer electrodes 21 and 22, the region between the outer electrode 20 and the uppermost inner electrode 21a is not polarized, as shown in FIG. 17.

In this embodiment, since the outer electrode 20 is insulated from the outer electrodes 21 and 22 on the primary side, no significant problem is posed even if the region between the outer electrode 20 and the uppermost inner electrode 21a is polarized. If, however, the region between the outer electrode 20 and the uppermost inner electrode 21a is polarized, the region generates a voltage upon vibration of the first region, and the generated voltage may appear between the outer electrodes 20 and 23 on the secondary side as noise. For this reason, it is preferable that this region be not polarized.

Since the piezoelectric transformer device of this embodiment is almost the same as the piezoelectric transformer device in FIG. 12 as for the multilayer structure of the first region, the manufacturing process, and the material for each electrode, a detailed description thereof will be omitted. However, the device of the second embodiment differs from the device of the first embodiment in the following points. The inner electrodes 21a and 22a are large enough to be exposed on the side surfaces of the device in the widthwise direction. The outer electrode 22 is formed on the lowermost portion of the device. Since the outer electrode 23 is a plate-like electrode, the outer electrode 23 is formed on the end portion of the second region after the piezoelectric ceramic tapes having the inner electrodes 21a and 22a formed thereon are stacked on each other and calcined.

The position where the outer electrode 21 is formed will be described next. In this embodiment, similar to the first embodiment, in order to prevent peeling, removal, and the like of the lead wires and the device itself and also prevent attenuation of vibrations, the centers of the outer electrode 20 and the interlevel connection conductors 24a and 24b are located at the position corresponding to L/4 (L is the length of the piezoelectric element 25 in the longitudinal direction) from the end portion of the first region, i.e., the position corresponding to a node of the driving vibration mode of the piezoelectric transformer device.

As described above, according to the piezoelectric transformer device of this embodiment, the outer electrodes 21 and 22 on the primary side can be electrically insulated from the outer electrodes 22 and 23 on the secondary side to prevent noise generated on the primary side from affecting the secondary side, thereby obtaining good boosting performance of the transformer.

In this embodiment, the inner electrodes 21a and 22a are exposed from the piezoelectric transformer device. As is apparent, however, these inner electrodes may be included as in the first embodiment.

Third Embodiment The third embodiment of the present invention will be described next with reference to FIGS. 18 to 22.

Figure 18:
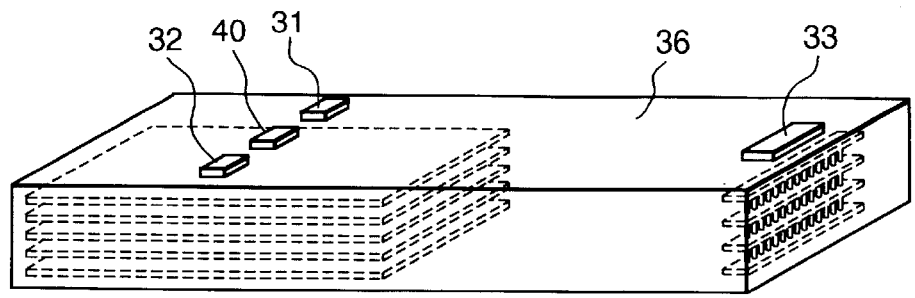
FIG. 18 is a perspective view showing a piezoelectric transformer device having a multilayer structure according to the third embodiment of the present invention.
Figure 19:
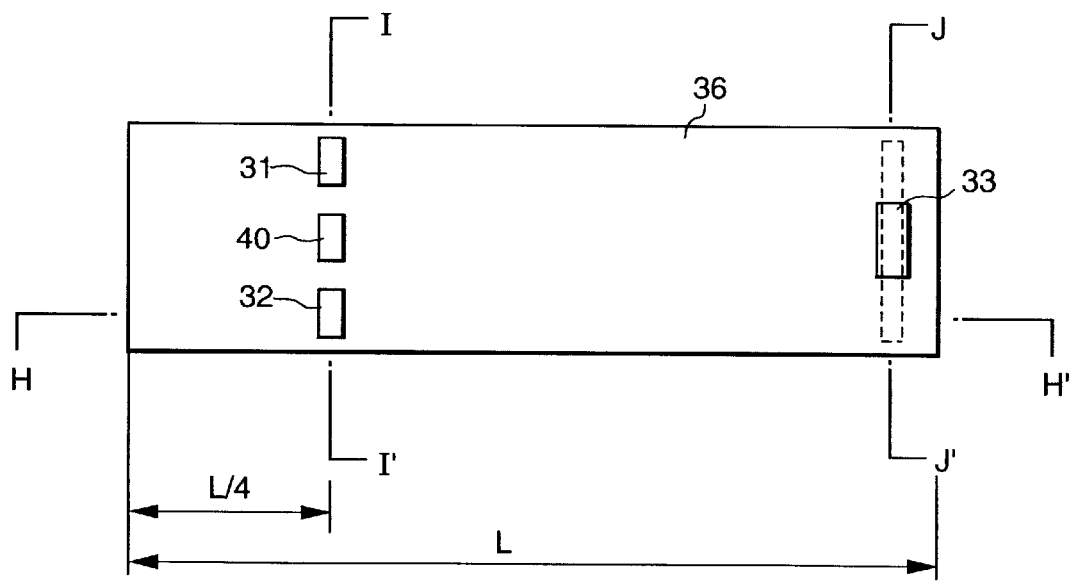
FIG. 19 is a plan view of the piezoelectric transformer device according to the third embodiment of the present invention in FIG. 18.

FIG. 18 is a perspective view showing a piezoelectric transformer device having a multilayer structure according to the third embodiment of the present invention. FIG. 19 is a plan view of the piezoelectric transformer device in FIG. 18.

The piezoelectric transformer device of this embodiment has an outer shape like the one shown in FIGS. 18 and 19. The right and left halves of this structure will be respectively referred to as the second and first regions hereinafter. Outer electrodes 31 and 32 as primary electrodes and an outer electrode 40 as a secondary electrode are formed on the upper surface of the first region of a piezoelectric element 36. An outer electrode 33 as a secondary electrode is formed near the end portion of the second region.

Since the outer electrode 40 is used together with the outer electrode 33 as a secondary electrode, the shape and area of the outer electrode 40 need not be specifically limited. In this embodiment, unlike the second embodiment, the outer electrode 40 has almost the same size as that of each of the outer electrodes 31 and 32 to minimize the electrode portion exposed from the piezoelectric element 36.

Figure 20:
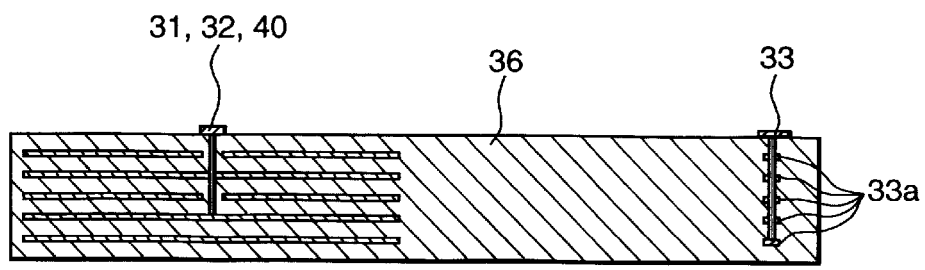
FIG. 20 is a sectional view taken along a line H–H' of the piezoelectric transformer device according to the third embodiment of the present invention in FIG. 19.
Figure 21:
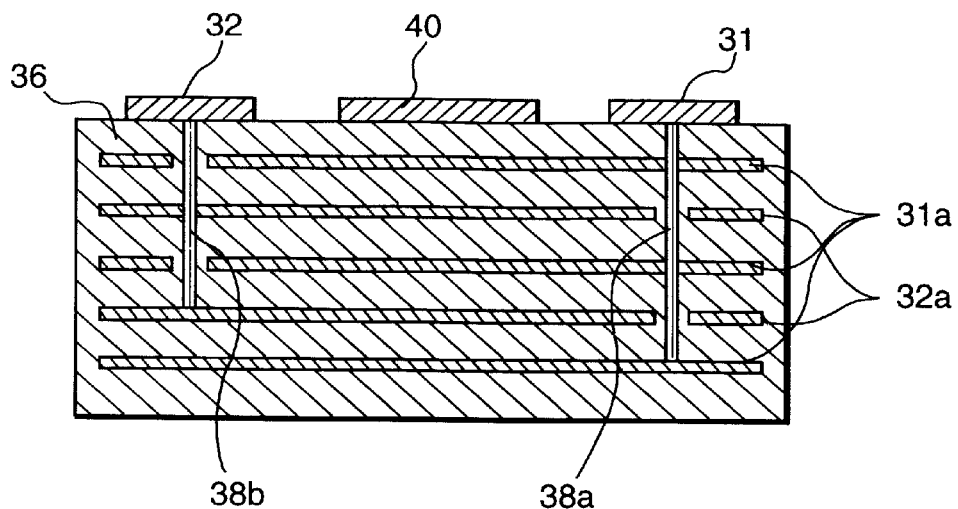
FIG. 21 is a sectional view taken along a line I–I' of the piezoelectric transformer device according to the third embodiment of the present invention in FIG. 19.

The internal structure of the piezoelectric transformer device of this embodiment will be described next. FIG. 20 is a sectional view taken along a line H–H7 of the piezoelectric transformer device in FIG. 19. FIG. 21 is a sectional view taken along a line I–I' of the piezoelectric transformer device in FIG. 19.

As shown in FIGS. 20 and 21, a plurality of inner electrodes 31a and 32a are alternately stacked inside the first region, and the spaces between the inner electrodes are filled with the piezoelectric element 36. Similar to the first embodiment, circular holes are formed in the inner electrodes 31a and 32a, so that the inner electrodes 31a and 32a are not connected to each other through interlevel connection conductors 38a and 38b.

The plurality of inner electrodes 31a are connected to each other through the interlevel connection conductor 38a. The interlevel connection conductor 38a extends toward the upper surface of the first region and is connected to the outer electrode 31.

Similarly, the plurality of inner electrodes 32a are connected to each other through the interlevel connection conductor 38b. The interlevel connection conductor 38b also extends toward the upper surface of the first region and is connected to the outer electrode 32.

Similar to the structure shown in FIG. 9 in the first embodiment, a secondary electrodes constituted in the form of a mesh and interlevel connection conductors and the outer electrode 33 serving as a lead electrode for extracting a boosted high AC voltage (a detailed description and illustration thereof will be omitted) are formed in the second region at a position near the longitudinal end portion.

Since the piezoelectric transformer device of this embodiment is almost the same as the piezoelectric transformer device in FIG. 12 as for the multilayer structure of the first region, the manufacturing process, and the material for each electrode, a detailed description thereof will be omitted. Note that the outer electrode 40 may be formed in the step of forming the outer electrodes 31 and 32 after the piezoelectric ceramic tapes having the inner electrodes 31a and 32a formed thereon are stacked one each other and calcined.

The positions where the outer electrodes 31, 32, and 40 are formed will be described next. In this embodiment, similar to the first embodiment, in order to prevent peeling, removal, and the like of the lead wires and the device itself and also prevent attenuation of vibrations, the centers of the outer electrodes 31, 32, and 40 and the interlevel connection conductors 28a and 28b are located at the position corresponding to L/4 (L is the length of the piezoelectric element 36 in the longitudinal direction) from the end portion of the first region, i.e., the position corresponding to a node of the driving vibration mode of the piezoelectric transformer device.

Figure 22:
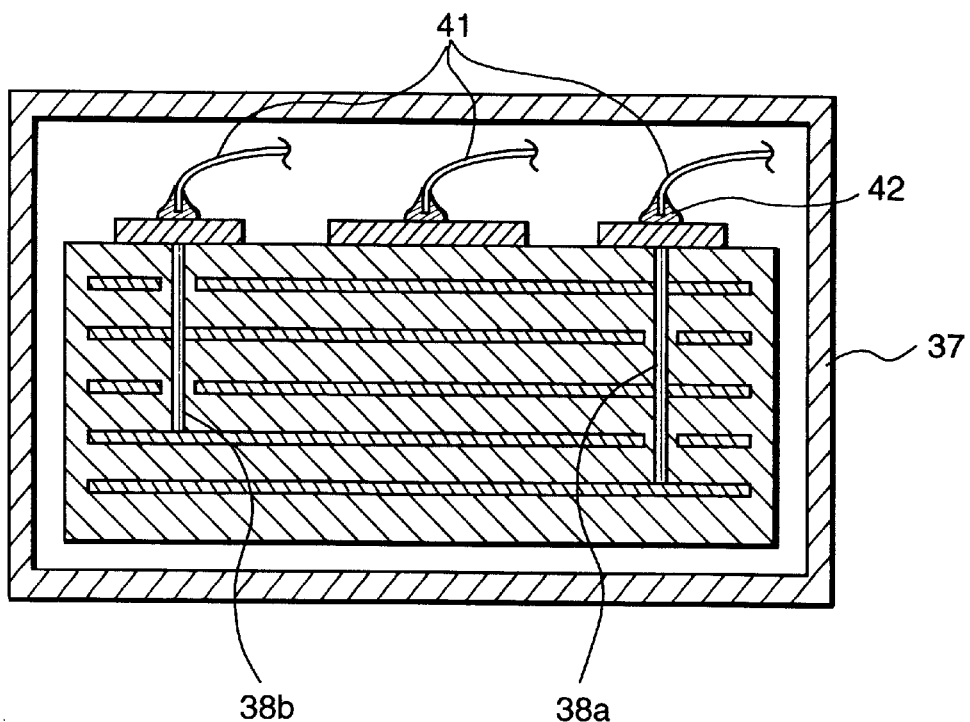
FIG. 22 is a sectional view showing the piezoelectric transformer device according to the third embodiment of the present invention which is housed in a case.

FIG. 22 is a sectional view showing the piezoelectric transformer device according to the third embodiment of the present invention which is housed in a case. The section in FIG. 22 is the same as that in FIG. 21. As shown in FIG. 22, when this piezoelectric transformer device is housed in a case 37, as in the structure shown in FIG. 11, no leads and solder portions are present on the lower side of the device.

When the device is to be used while it is housed in the case in this manner, the outer electrode 40 may be formed on the entire surface of the first region in an H form while avoiding contact with the outer electrodes 31 and 32 in consideration of the resistance of the outer electrode 40 with respect to a current flowing therein.

As described above, according to the piezoelectric transformer device of this embodiment, the structure in which only the outer electrodes 31, 32, 40, and 33 are exposed on the same surface of the device can be realized. In addition to the effects (advantages) of the first embodiment, therefore, the device of the third embodiment can obtain the effects of the second embodiment, because the outer electrodes 31 and 32 on the primary side can be electrically insulated from the outer electrodes 33 and 40 on the secondary side. That is, an easy-to-handle piezoelectric transformer device having good performance can be realized.

Fourth Embodiment

According to the findings of the present inventors, in a piezoelectric transformer device incorporating interlevel connection conductors like the piezoelectric transformer device of each embodiment described above, the interlevel connection conductors, similar to the inner electrodes, tend to attenuate the vibrations of the piezoelectric transformer device and decrease the boosting ratio (conversion efficiency). In this embodiment, therefore, inner electrodes and interlevel connection conductors having high hardness are used for a piezoelectric transformer device having the structure of each embodiment described above, and the diameter of each interlevel connection conductor is set to be a predetermined value or less, thereby suppressing attenuation of the mechanical vibrations of the piezoelectric transformer device. Materials of the inner electrode and the interlevel connection conductors which will be described below in this embodiment can be applied to a piezoelectric transformer device having a general multilayer structure.

Hence, before describing the materials of the fourth embodiment, the structure and method of the piezoelectric transformer device having a general multilayer structure will be described below with reference to FIGS. 23 to 29. Thereafter, the materials in the fourth embodiment will be described with reference to FIGS. 30 and 31.

<Illustration of Structure of Piezoelectric Transformer Device Having General Multilayer Structure>

The structure of the general piezoelectric transformer device to which the inner electrode materials in this embodiment can be applied will be described first with reference to FIGS. 23 to 25.

Figure 23:
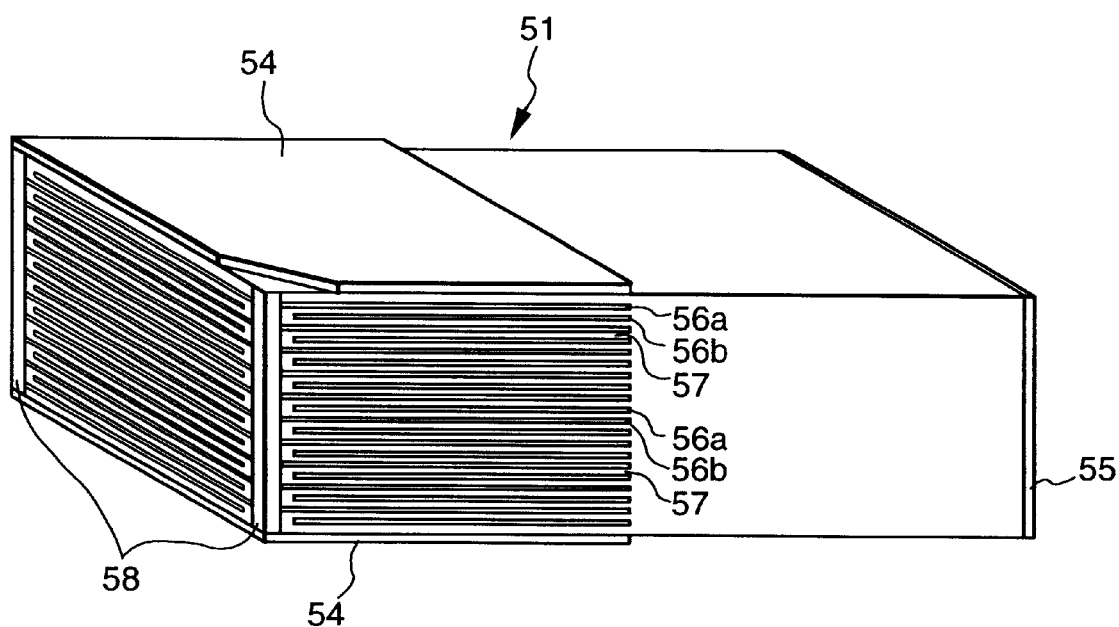
FIG. 23 is a perspective view showing a piezoelectric transformer device having a general multilayer structure to which inner electrode materials in the fourth embodiment of the present invention can be applied.

FIG. 23 is a perspective view showing a piezoelectric transformer device having a general multilayer structure to which the inner electrode materials in the fourth embodiment of the present invention can be applied This device is an example of the Rosen type piezoelectric transformer device.

A piezoelectric transformer device 51 with a multilayer structure has an outer shape like the one shown in FIG. 23. In FIG. 23, the right and left halves of this structure will be respectively referred to as the second and first regions.

In the first region, ceramic piezoelectric members 57 and inner electrodes 56a and 56b are alternately stacked. Note that the number of ceramic piezoelectric members stacked is larger than that of inner electrodes by one. Outer electrodes 54 as primary electrodes are formed on the upper and lower surfaces of the first region. An outer electrode 55 as a secondary electrode is formed on an end portion of the second region. The first region is polarized in the thickness direction (the vertical direction in FIG. 23), and the second region is polarized in the longitudinal direction (the horizontal direction in FIG. 23).

In the first region, the inner electrodes 56a and 56b are connected in the same manner as in each embodiment described above. That is, the alternate inner electrodes 56a and 56b stacked on each other are electrically connected, and hence two inner electrode groups which are electrically insulated from each other are formed. The two inner electrode groups are electrically connected to the electrodes 54 on the upper and lower surfaces of the first region, respectively.

In the first region of the piezoelectric transformer device 51, the inner electrodes 56a and 56b and the ceramic piezoelectric member 57 have the same flat shape, and the inner electrodes 56a and 56b are exposed on the side surfaces of the device. Interlevel connection conductors 58 for connecting the pluralities of inner electrodes 56a and 5b as the two inner electrode groups are formed on the two corner portions of an end portion of the first region. In this case, at the corner portions of the end portion, one of the two corner portions of each of the inner electrodes 56a and 56b is notched in the form of aright-angled triangle (apparently, the notched shape is not limited to a right-angled triangle), and the notched corners of the inner electrodes 56a and 56b are located on the opposite sides. Therefore, only the inner electrodes having corner portions are connected to the interlevel connection conductor 58. Each interlevel connection conductor 58 is electrically connected to a corresponding outer electrode 54. With this structure, the inner electrodes 56a and 56b constitute the two inner electrode groups.

The inner electrode materials which will be described below in this embodiment can be applied to not only the piezoelectric transformer device having the structure shown in FIG. 23 but also piezoelectric transformerdevice having the following structure.

Figure 24:
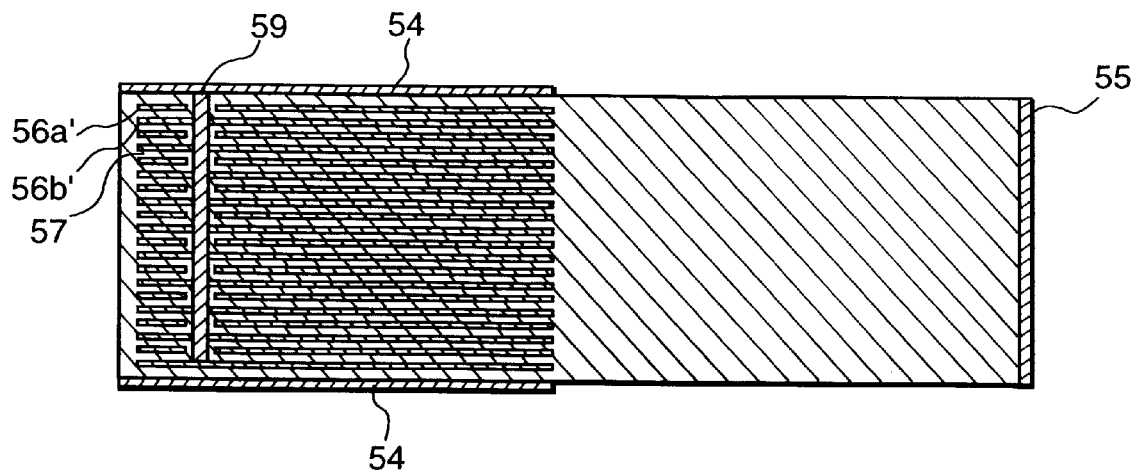
FIG. 24 is a longitudinal sectional view of the piezoelectric transformer device having the general multilayer structure to which the materials of the inner electrode and the interlevel connection conductors in the fourth embodiment of the present invention can be applied.

FIG. 24 is a longitudinal sectional view of a piezoelectric transformer device having a multilayer structure to which the materials of the inner electrode and the interlevel connection conductors in the fourth embodiment of the present invention can be applied (note that this sectional view is taken along an interlevel connection conductor 59). FIG. 25 is a sectional view of the piezoelectric transformer device in FIG. 24, taken along the interlevel connection conductors 59 in the widthwise direction.

Figure 25:
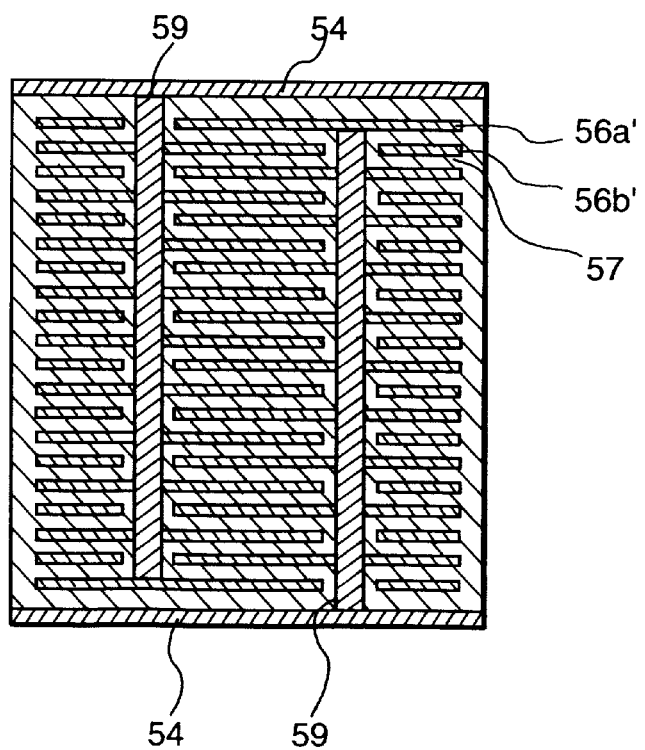
FIG. 25 is a sectional view taken along the interlevel connection conductor portion of the piezoelectric transformer device shown in FIG. 24 in the widthwise direction.

Outer electrodes 54 and inner electrodes 56a' and 56b' in FIGS. 24 and 25 are electrically connected to each other in the same manner as in the piezoelectric transformer device shown in FIG. 23 described above. Note that the structure of connection between the interlevel connection conductors 59, the respective inner electrodes, and the respective outer electrodes is different from that in FIG. 23. This connection structure will be described below.

In the first region, the two interlevel connection conductors 59 are formed inside the device, and the inner electrodes 56a' and 56b' on the respective layers are connected to the interlevel connection conductors 59. As shown in FIG. 25, the inner electrodes 56a' and 56b' are alternately stacked, and the inner electrodes of the same type, i.e., the alternate layers, are connected to each other through the interlevel connection conductor 59. Holes are formed in the respective inner electrodes. With this structure, two inner electrode groups are formed. Note that the two interlevel connection conductors 59 are preferably formed at the position corresponding to a node of the driving vibration mode of the piezoelectric transformer device, as in each embodiment described above.

The resonance frequency of a piezoelectric transformer device corresponds to the material and the length in the vibrating direction. When an AC voltage having a frequency corresponding to the resonance frequency is applied between the two outer electrodes 54 of the piezoelectric transformer device having the above multilayer structure, the piezoelectric transformer device mechanically vibrates at the resonance frequency owing to the inverse piezoelectric effect, thereby generating standing waves. When the piezoelectric transformer device vibrates in the λ mode, the nodes of the standing waves (stationary waves) are located at the positions corresponding to ¼ the length of the device (L/4 when the length of the device is presented by L) from the two end portions of the device. Owing to the piezoelectric effect produced by the standing waves, an AC voltage is generated between the outer electrodes 54 and the outer electrode 55. A general piezoelectric transformer device is formed such that the distance between the input electrode and the output electrode is larger than that between the input electrodes on the primary side. For this reason, the voltage generated between the input and output electrodes is higher than the voltage applied between the input electrodes.

The piezoelectric transformer device with the multilayer structure described with reference to FIGS. 23 to 25 has the same dimensions as those of the general device, i.e., a length of about 10 to 50 nm, a width of about 2 to 15 mm, and a thickness of about 0.3 to 5 mm. In the first region, about 5 to 50 piezoelectric layers, each having a thickness of about 50 to 300 $\mu$m, are stacked on each other.

<Illustration of Method of Manufacturing Piezoelectric Transformer Device Having General Multilayer Structure>

A method of manufacturing the piezoelectric transformer device having the above structure is not specifically limited. However, the device is preferably manufactured by using a known method of manufacturing a low-temperature calcined multilayer ceramic substrate. A method of manufacturing the piezoelectric transformer device described with reference to FIGS. 23 to 25 using the method of manufacturing a low-temperature calcined multilayer ceramic substrate will be briefly described below.

The manufacturing process for the piezoelectric transformer device shown in FIG. 23 will be described first. When the inner electrodes are to be electrically connected to each other by using interlevel connection conductors (interlevel connection conductors 58) like those shown in FIG. 23, piezoelectric ceramic tapes are formed first by the doctor blade method or the like, and are then cut to obtain a device having desired plane dimensions. In this case, the cut size of each piezoelectric ceramic tape may be set to the total length of an array of a desired number of piezoelectric transformer devices in consideration of mass production so as to obtain a plurality of piezoelectric transformer devices by cutting a multilayer structure formed by stacking a plurality of piezoelectric ceramic tapes.

A conductor paste for an inner electrode is printed on the surface of each piezoelectric ceramic tape in the form of the above inner electrode by using a mesh mask. In the case of the piezoelectric transformer device shown in FIG. 23, a notched portion in the form of a right-angled triangle is formed in each inner electrode at one of the corner portions of the longitudinal end portion of the first region of the piezoelectric transformer device. As is apparent, in the piezoelectric transformer device shown in FIG. 23, the inner electrodes have two types of notch patterns formed by notching the corner portions at different positions.

Piezoelectric ceramic tapes on which the inner electrodes having these two patterns are printed are alternately stacked on each other by desired same number. A piezoelectric ceramic tape having no inner electrode printed thereon is stacked on the upper surface of the resultant multilayer structure. The piezoelectric ceramic tapes having the stacked inner electrodes are subjected to thermocompression bonding and calcined.

Subsequently, the resultant structure is subjected to processes, e.g., cutting and polishing, as needed, and the Ag paste is baked. With this process, the outer electrodes 54 and 55 and the interlevel connection conductors 54 are formed, and polarization is performed.

With the above manufacturing process, the piezoelectric transformer device having the multilayer structure shown in FIG. 23 is obtained.

A manufacturing process for the piezoelectric transformer device shown in FIGS. 24 and 25 will be described next. In case of a structure in which the respective inner electrodes are connected to each other through interlevel connection conductors as shown in FIGS. 24 and 25, piezoelectric ceramic tapes are formed first by the doctor blade method or the like, and are cut to obtain a device having desired plane dimensions. In addition, holes are formed in the portions of the respective tapes with which interlevel connection conductors are filled. In this case as well, the cut size of each piezoelectric ceramic tape may be set to the total length of an array of a desired number of piezoelectric transformer devices in consideration mass production so as to obtain a plurality of piezoelectric transformer devices by cutting a multilayer structure formed by stacking a plurality of piezoelectric ceramic tapes.

Figure 26:
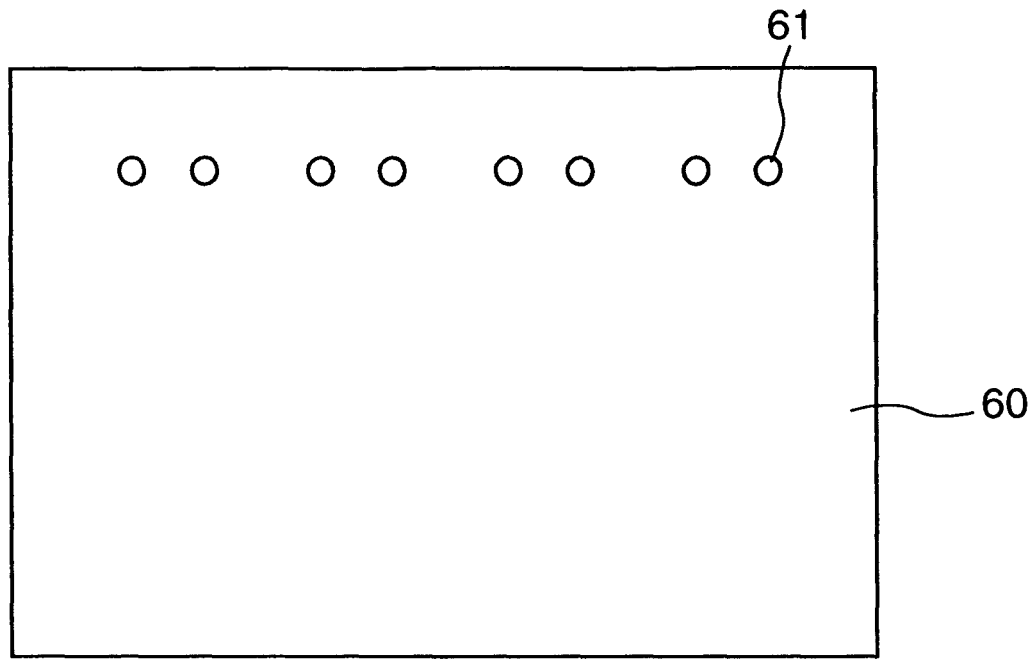
FIG. 26 is a plan view showing a piezoelectric ceramic tape having holes formed therein for the piezoelectric transformer device shown in FIGS. 24 and 25.

FIG. 26 shows a piezoelectric ceramic tape, for the piezoelectric transformer device shown in FIGS. 24 and 25, in which holes are formed. Referring to FIG. 26, eight holes 61 are formed in pairs in a piezoelectric ceramic tape 60. If, therefore, a multilayer structure obtained by stacking a plurality of piezoelectric ceramic tapes 60, and calcining them is cut, four piezoelectric transformer devices can be obtained.

Figure 27:
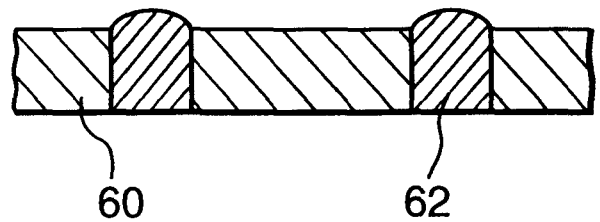
FIG. 27 is a partial sectional view showing a state in which an interlevel connection conductor paste is filled in holes in the piezoelectric ceramic tape for the piezoelectric transformer device shown in FIGS. 24 and 25.

An interlevel connection conductor paste is filled in each of these holes by the printing method using a metal mask or the like. FIG. 27 shows this state. FIG. 27 is a partial sectional view showing a state in which an interlevel connection conductor paste 62 is filled in each piezoelectric ceramic tape 60 for the piezoelectric transformer device shown in FIGS. 24 and 25.

Figure 28:
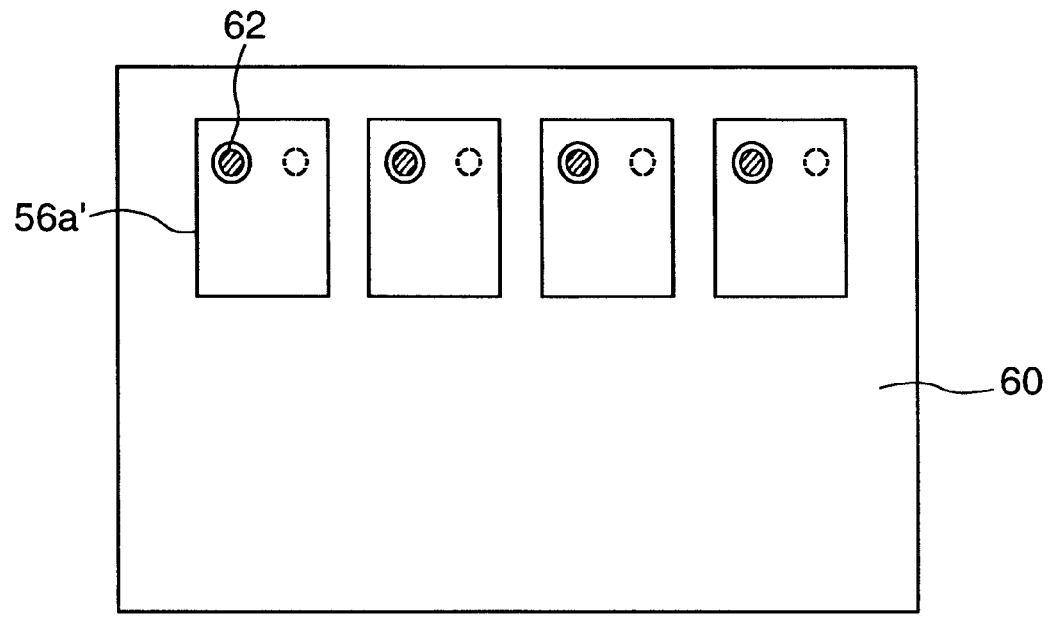
FIG. 28 is a plan view showing a piezoelectric ceramic tape after inner electrodes are printed thereon for the piezoelectric transformer device shown in FIGS. 24 and 25.
Figure 29:
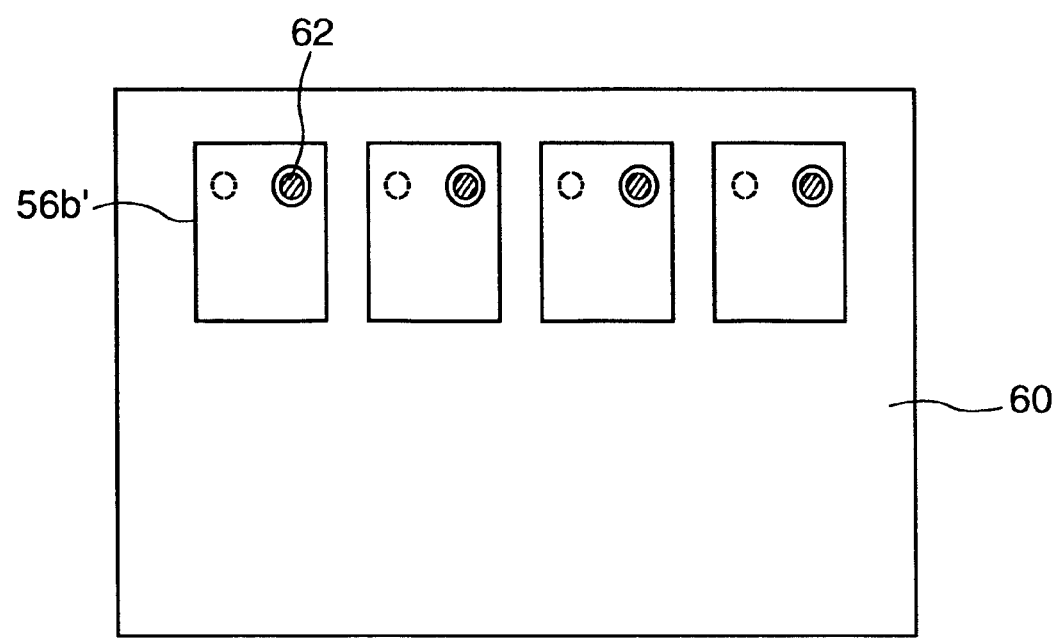
FIG. 29 is a plan view showing a piezoelectric ceramic tape after inner electrodes are printed thereon for the piezoelectric transformer device shown in FIGS. 24 and 25.

Subsequently, an inner electrode paste is printed on each piezoelectric ceramic tape in the form of the inner electrodes 56a' or 56b' by using a mesh mask. FIGS. 28 and 29 show this state.

FIGS. 28 and 29 show states in which the inner electrodes 56a' and 56b' are printed on the piezoelectric ceramic tapes 60 for the piezoelectric transformer device shown in FIGS. 24 and 25. As shown in FIGS. 28 and 29, circular holes are formed in the inner electrodes 50a' and 56b' such that the interlevel connection conductors are not connected to the corresponding inner electrodes. In the case shown in FIG. 28, for example, since a hole is formed in the upper left portion of each inner electrode 56a', insulation between the inner electrode 56a' and the interlevel connection conductor 62 is maintained. A hole is formed in the upper right portion of each inner electrode 56b'. When, therefore, this inner electrode is printed on the tape 60, the inner electrode is connected to the interlevel connection conductor 62 at this portion.

A plurality of piezoelectric ceramic tapes in the above state shown in FIGS. 28 and 29 are manufactured, and alternately stacked on each other. One hole is formed in the uppermost surface of the resultant multilayer structure to allow connection to the outer electrode 54 when the device is finished, and an piezoelectric ceramic tape having no inner electrode printed thereon is stacked on the structure.

The stacked piezoelectric ceramic tapes are subjected to thermocompression bonding and calcined. The resultant structure is then subjected to processes, e.g., cutting and polishing, as needed. The outer electrodes 54 and 55 are formed by baking an Ag paste, and the resultant structure is polarized.

With the above manufacturing process, the piezoelectric transformer device having the multilayer structure shown in FIGS. 24 and 25 is obtained. Note that the piezoelectric transformer device of each embodiment may be mass-produced by using the above manufacturing process as a basic process.

<Illustration of Materials of the Fourth Embodiment>
(Internal Electrode Materials)

When ceramic dielectric members are to be stacked on each other, Ag, an Ag—Pd mixture, an Ag—Pt mixture, Pd, Pt, Cu, Ni, or the like is used as an electrode material. When, however, a Pb-based piezoelectric material (Pb (Zr, Ti) $O_3$) used for a piezoelectric transformer device is to be used, this piezoelectric material must be calcined at 1,000° C. or higher in an oxygen atmosphere. If, therefore, an electrode material is to be calcined together with such a piezoelectric material, Ag, Cu, and Ni cannot be used. Since Pt is expensive, this material can hardly be used alone, and a conductor such as an Ag—Pt mixture or an Ag—Pt mixture is generally used.

In this embodiment, each of the inner electrodes 56a and 56b (56a' and 56b ') is made of an Ag—Pd mixture containing 20 to 80 wt % of Pd.

The thickness of each inner electrode influences the Qm (mechanical quality coefficient). Although the degree of this influence depends on the dimensions of the piezoelectric transformer device itself and the number of inner electrodes stacked, the thickness of each inner electrode is set to 1 to 5 μm in this embodiment which employs the above general dimensions and the number of inner electrodes stacked.

The Qm will be described below. The conversion efficiency of the piezoelectric transformer device is closely associated with the Qm of the device. That is, as the Qm increases without any changes in other constants, the energy loss decreases, and the conversion efficiency increases. Such a relationship between the energy loss and the Qm can be derived from the formula for the boosting ratio of the Rosen type piezoelectric transformer device.

The Qm also represents the resistance to attenuation of applied vibrations. As the resistance to attenuation of applied vibrations increases, the energy required to maintain the vibrations decreases. As a result, the conversion efficiency increases.

In general, a material having a high Qm is used as a material for each piezoelectric member used for a piezoelectric transformer device. If, for example, a PZT-based piezoelectric ceramic material is to be used, a piezoelectric material having a high Qm can be obtained by adding a trace amount of Fe or Mn to the ceramic material.

(Ceramic Piezoelectric Member)

As a ceramic material for a piezoelectric element, for example, a lead-zirconate-titanate-based (PZT-based) ceramic material is generally used. In this embodiment, however, an Ag—Pd mixture is used to increase the conversion efficiency (boosting ratio). In general, an Ag—Pd mixture has a higher hardness than an Ag—Pt mixture. However, if an Ag—Pd mixture contains less than 20 wt % of Pd, the Qm decreases because of poor hardness of each interlevel connection conductor (electrode). As a result, an increase in conversion efficiency is suppressed. When the Pd content exceeds 80 wt %, the calcined conductor decreases in density. As a result, the Qm decreases, and hence an increase in conversion efficiency cannot be attained.

In this embodiment, an Ag—Pd mixture containing 20 wt % or more and 80 wt % or less of Pd is used as a material for the ceramic piezoelectric member 57.

If an Ag—Pd conductor is inserted between ceramic piezoelectric members, the Qm basically decreases as compared with a single ceramic piezoelectric member. In the piezoelectric transformer device having the above dimensions and the number of inner electrodes, if each interlevel connection conductor is thicker than 5 $\mu$m, a decrease in this Qm cannot be neglected, and a decrease in conversion efficiency falls outside the allowable range. In contrast to this, assume that each inner electrode is thinner than 1 $\mu$m. In this case, when a plurality of inner electrodes are calcined together with ceramic piezoelectric members, the inner electrode material tends to round owing to the surface tension. As a result, the inner electrode material becomes meshy, and a continuous plate-like conductor cannot be obtained. If the inner electrodes in such a state are used, a uniform electric field cannot be applied to the ceramic piezoelectric members between the respective inner electrodes. Consequently, a sufficient electro-mechano energy conversion function cannot be obtained, and the conversion efficiency suffers.

(Interlevel Connection Conductor)

When electrical connection of the respective inner electrodes (two inner electrode groups) is to be realized by using interlevel connection conductors, the vibrations of the device (ceramic piezoelectric members) are attenuated by the interlevel connection conductor, and the conversion efficiency decreases owing to the same reasons as in the above case of the inner electrodes. In addition, if the diameter of each interlevel connection conductor increases, the vibrations of each ceramic piezoelectric element are attenuated more easily. In contrast to this, if the diameter of each interlevel connection conductor decreases, the conductor resistance of each interlevel connection conductor itself becomes too large to be neglected, and the impedance of the overall ceramic piezoelectric members increases. As a result, the Q value decreases, and hence the conversion efficiency decreases as well.

In this embodiment, the interlevel connection conductor 59 itself consists of an Ag—Pd mixture containing 20 wt % or more and 80 wt % or less of Pd, and has a diameter of 20 $\mu$m or less.

When interlevel connection conductors are used to connect inner electrodes to each other in the above manner, the interlevel connection conductors can be placed at an arbitrary position within the plane of the first region of a piezoelectric transformer device. However, they are preferably placed at the position corresponding to a node of the vibrations of the device. By placing the interlevel connection conductors at the position where the device least vibrates, the attenuation of the vibrations of the device due to the interlevel connection conductors can be minimized.

DESCRIPTION OF EXAMPLES

Nonrestrictive Examples of the piezoelectric transformer device shown in FIG. 23 and the piezoelectric transformer device shown in FIGS. 24 and 25, and Comparative Examples will be described next.

Examples 1 to 5 of the piezoelectric transformer device in FIG. 23 and Comparative Examples 1 to 5 will be described first with reference to FIG. 30.

Examples 1–5

100 parts by weight of a Pb (Zr, Ti)-$O_3$-based piezoelectric material powder was mixed with 25 parts by weight of water and 10 parts by weight of an emulsion type acrylic-based binder to prepare a slurry by using a ball mill. A tape was formed from the slurry by using a doctor blade unit to have a thickness of 130 $\mu$m after being dried, and a thickness of about 100 $\mu$m after being calcined.

The resultant tape was cut into a rectangle 100 mm long and 100 mm wide. Thereafter, the tape was stuck on a printing frame, and an inner electrode containing Ag and Pd at a weight ratio in FIG. 30 was printed on the tape portion corresponding to the first region of the piezoelectric transformer device by using a screen mask. Note that the inner electrodes were printed according to two types of patterns such that a notched portion was formed in each inner electrode in the form of a right-angled triangle having two 2-mm long sides at one of the corner portions of the longitudinal end portion of the first region of a multilayer structure obtained by stacking the inner electrodes, calcining the stacked structure, and cutting the structure.

In addition, the inner electrodes were printed while the thickness of the emulsion of the screen mask and the solid content of the paste were changed, thereby forming inner electrodes having predetermined thicknesses in FIG. 30 after calcination.

Subsequently, the tapes on which the inner electrodes having the above two types of patterns were printed were alternately stacked 10 layers each, and a piezoelectric ceramic tape like the above tape having no inner electrode printed thereon was stacked on the surface of the resultant structure on which the inner electrode was exposed.

The resultant structure was subjected to thermocompression bonding at 100° C. and 30 Mpa, and calcined at 1,150° C. in the air for two hours.

The resultant calcined structure was cut to a length of 48 mm and a width of 10 mm, and the outer electrodes 54 on the upper and lower surfaces of the first region and the outer electrode 55 on the longitudinal end portion of the second region were printed with the Ag paste and baked at 700° C. For the outer electrodes 54, identical notched portions in the form of right-angled triangles were formed such that the respective adjacent inner electrodes had horizontally reverse patterns. In addition, similar to the outer electrodes 54 and 55, the interlevel connection conductors 58, each having a width of 1 mm in both the widthwise and longitudinal directions, were printed on the entire outside portions of the two corner portions of the longitudinal end portion of the first region in the thickness direction with an Ag paste at 7000° C.

With this process, as shown in FIG. 23, the device before polarization which had inner electrodes electrically connected to the outer electrodes was obtained.

The first region of this device before polarization was polarized in the air at 250° C. and an electric field strength of 3 MV/m (300 V/100 $\mu$m). In the second region, the input electrode (outer electrode 54) was short-circuited and polarized in the air at 250° C. and an electric field strength of 0.8 MV/m (19 kV/24 mm).

With the above process, the multilayer type piezoelectric transformer devices according to the embodiment in FIG. 23 were obtained.

A 50-k$\Omega$ load resistor, an ammeter, and a voltmeter were connected to the output side of each multilayer type piezoelectric transformer device obtained in this manner, and a power supply, an ammeter, and a voltmeter were connected to the input side. In this state, the input power and the output power were measured while a predetermined output was kept at 2 W, thereby calculating the conversion efficiency. FIG. 30 shows the result.

After the conversion efficiency was measured, each multilayer type piezoelectric transformer device was cut, and the thickness of each inner electrode was measured. As a result, it was confirmed that each inner electrode had a predetermined value.

Comparative Examples 1–5

Multilayer type piezoelectric transformer devices were manufactured by using the Ag/Pd composition ratios in FIG. 30 in the same manner as in the Examples such that the inner electrodes had the thicknesses in FIG. 30.

The conversion efficiencies of the respective devices were measured, together with the thicknesses of the inner electrodes as in the Examples. FIG. 30 shows the results.

As is apparent from the results shown in FIG. 30, when the Ag/Pd ratios in the inner electrodes fall within the range of 80/20 to 20/80, and the thicknesses fall within the range of 1 to 5 $\mu$m, the conversion efficiencies of the piezoelectric transformer devices become 85% or more. Obviously, an improvement in conversion efficiency can be attained as compared with the Comparative Examples in which the above values fall outside of the ranges.

Examples 6 to 12 of the piezoelectric transformer device shown in FIGS. 24 and 25 and Comparative Examples 6 to 12 will be described next with reference to FIG. 31.

Examples 6–12

100 parts by weight of a Pb (Zr, Ti)-O$_3$-based piezoelectric material powder was mixed with 25 parts by weight of water and 10 parts by weight of an emulsion type acrylic-based binder to prepare a slurry by using a ball mill. A tape was formed from the slurry by using a doctor blade unit to have a thickness of 130 $\mu$m after being dried, and a thickness of about 100 $\mu$m after being calcined.

The resultant tape was cut into a rectangle 100 mm long and 100 mm wide. Thereafter, the tape was stuck on a printing frame, and circular holes to be filled with interlevel connection conductors were formed in the tape at predetermined positions by using a punching unit such that the respective holes had the diameters shown in FIG. 31 after calcination. The holes were arranged at 2-mm intervals at the position 12 mm from the longitudinal end portion of the device, i.e., the position corresponding to a node of the vibrations of the mode vibrating in the $\lambda$ mode after calcination and cutting.

The above holes were then filled with interlevel connection conductor pastes obtained by adding an organic binder and the like to Ag—Pd mixtures with different composition ratios as shown in FIG. 31 by using the printing method using a metal mask. The result structures were dried. Inner electrodes formed at the same Ag/Pd ratios as those of the interlevel connection conductors were printed on the piezoelectric ceramic tapes having the holes filled with the interlevel connection conductor pastes by using screen masks such that no inner electrodes protruded from the side surfaces of the cut tapes. In the above form shown in FIGS. 28 and 29, each inner electrode was printed such that the electrode became 23.5 mm long and 9 mm wide after calcination, and had a circular hole which had the same center as that of the corresponding interlevel connection conductor and was 1 mm longer in diameter than the interlevel connection conductor.

Subsequently, the inner electrodes were printed while the thickness of the emulsion of the screen mask and the solid content of the paste were changed, thereby forming inner electrodes having predetermined thicknesses in FIG. 31.

Ten patterns like those shown in FIG. 29 and nine pattern like those shown in FIG. 28 were alternately tacked on each other such that the inner electrode formation surfaces became the upper surfaces and the pattern like the one shown in FIG. 29 became the uppermost surface. A piezoelectric ceramic tape having only an interlevel connection conductor on the right side formed thereon (having no inner electrode printed thereon) was stacked on the uppermost surface of the multilayer structure. A piezoelectric ceramic tape on which an interlevel connection conductor on the right side like the one shown in FIG. 28 was not formed was stacked on the lowermost surface of the multilayer structure.

Each multilayer structure was subjected to thermocompression bonding at 100° C. and 30 Mpa, and calcined at 1,150° C. in the air for two hours.

These samples were then cut to a length of 48 mm and a width of 10 mm such that the inner electrodes were not exposed on the side surfaces. With an Ag paste, the outer electrodes 54 were printed on the upper and lower surfaces of the first region of each sample, and the outer electrode 55 was printed on the longitudinal end portion of the second region. The resultant structures were baked at 700° C. As a result, piezoelectric transformer devices before polarization, each having a structure like that shown in FIGS. 24 and 25, were obtained.

The first region (multilayer side) of each device before polarization was subjected to a polarization process in the air at 250° C. and an electric field strength of 3 MV/m (300 V/100 $\mu$m). In the second region, the input electrode (outer electrode 54) was short-circuited and polarized in the air at 250° C. and an electric field strength of 0.8 MV/m (19 kV/24 mm).

With the above process, the multilayer type piezoelectric transformer devices according to the embodiment in FIGS. 24 and 25.

A 50-k$\Omega$ load resistor, an ammeter, and a voltmeter were connected to the output side of each multilayer type piezoelectric transformer device obtained in this manner, and a power supply, an ammeter, and a voltmeter were connected to the input side. In this state, the input power and the output power were measured while a predetermined output was kept at 2 W, thereby calculating the conversion efficiency. FIG. 31 shows the result.

After the conversion efficiency was measured, each multilayer type piezoelectric transformer device was cut, and the diameter of each hole and the thickness of each inner electrode were measured. As a result, each value was a predetermined value.

Comparative Examples 6–13

Multilayer type piezoelectric transformer devices were manufactured by using the Ag/Pd composition ratios in FIG. 31 in the same manner as in Examples 6 to 12 such that the inner electrodes had the thicknesses in FIG. 31.

The conversion efficiencies of the respective devices were measured, together with the diameters of the holes and the thicknesses of the inner electrodes as in Examples 6 to 12. FIG. 30 shows the results.

As is apparent from the results shown in FIG. 31, when the Ag/Pd ratios in the inner electrodes fall within the range of 80/20 to 20/80, while the thicknesses of the inner electrodes fall within the range of 1 to 5 µm and the diameters of the interlevel connection conductors fall within the range of 50 to 200 µm, the conversion efficiencies of the piezoelectric transformer devices become 85% or more. That is, obviously, a significant improvement in conversion efficiency can be attained as compared with the Comparative Examples in which the above values fall outside the ranges.

As described above, if a piezoelectric transformer device having a multilayer structure is formed by using the inner electrode material and the interlevel connection conductors in this embodiment, a piezoelectric transformer device having good conversion (boosting) performance can be realized. Therefore, the device can be reduced in size as compared with the conventional piezoelectric transformer device having a similar output capacity.

As is apparent, the present invention is not limited to each embodiment described above with reference to the accompanying drawings, and combinations of the embodiments are included in the scope of the invention.

As has been described above, according to the present invention, there is provided a piezoelectric transformer device which ensures safety, is easy to handle, and exhibits good performance as a transformer.

There are also provided a piezoelectric transformer device having a high conversion efficiency, a piezoelectric transformer device which is easy to handle in an automatic manufacturing process, and a piezoelectric transformer device having primary and secondary sides electrically insulated from each other and exhibiting good transforming performance.

As many apparently widely different embodiments of the present invention can be made without departing from the spirit and scope thereof, it is to be understood that the invention is not limited to the specific embodiments thereof except as defined in the appended claims.

What is claimed is:

1. A piezoelectric transformer device having a first region polarized in a thickness direction and having primary electrodes formed therein, a second region polarized in a longitudinal direction and having secondary electrodes formed therein, and a plurality of piezoelectric members stacked on each other, comprising:

a plurality of first inner electrodes arranged as said primary electrodes between said plurality of piezoelectric members and included in said first region;

a plurality of second inner electrodes arranged as said secondary electrodes between said plurality of piezoelectric members and included in said second region;

first outer electrodes formed on a surface of said piezoelectric transformer device to apply a voltage to said plurality of first inner electrodes; and a second outer electrode formed on the same surface of said piezoelectric transformer device to extract a voltage generated in said piezoelectric transformer device upon application of the voltage through said plurality of second inner electrodes, wherein said plurality of first inner electrodes are alternately connected to each other through at least two first columnar conductors included in said first region, thereby constituting two inner electrode groups, and said plurality of second inner electrodes are connected to each other in the form of a mesh through a plurality of second columnar conductors included in said second region.

2. The device according to claim 1, wherein said first outer electrodes are formed at a position corresponding to a node of a driving vibration mode of said piezoelectric transformer device.

3. The device according to claim 1, wherein said at least two columnar conductors are formed at a position corresponding to a node of a driving vibration mode of said piezoelectric transformer device.

4. The device according to claim 1, wherein said secondary electrodes constituted by said plurality of second inner electrodes and said columnar conductors occupy not less than 5% of a cross-sectional area of said piezoelectric transformer device in a widthwise direction.

5. The device according to claim 1, further comprising a third outer electrode insulated from said first and second inner electrodes and said first and second outer electrodes and formed, as another electrode of said secondary electrodes, on the same surface of said first region.

6. The device according to claim 5, wherein one of said plurality of piezoelectric members which is placed between said third outer electrode and said first inner electrode nearest thereto is not polarized.

7. The device according to claim 6, wherein said third outer electrode is formed at a position corresponding to a node of a driving vibration mode of said piezoelectric transformer device.

8. The device according to claim 1, wherein each of said first inner electrodes and/or said second inner electrodes essentially consists of an Ag—Pd mixture containing 20 to 80 wt % of Pd, and has a thickness of 1 to 5 µm.

9. The device according to claim 8, wherein said columnar conductor essentially consists of an Ag—Pd mixture containing 20 to 80 wt % of Pd, and has a diameter of not more than 200 µm.

10. A piezoelectric transformer device having a first region polarized in a thickness direction and having primary electrodes, formed therein, a second region polarized in a longitudinal direction and having secondary electrodes formed therein, and a plurality of piezoelectric members stacked on each other, comprising:

a plurality of inner electrodes arranged as said primary electrodes between said plurality of piezoelectric members in said first region;

a plurality of first outer electrodes formed on a surface of said piezoelectric transformer device to apply a voltage to said plurality of inner electrodes;

a second outer electrode formed as said secondary electrode on an end portion of said second region; and a third outer electrode insulated from said plurality of inner electrodes and said first and second outer electrodes and formed as another electrode of said secondary electrodes on a surface of said first region of said piezoelectric transformer device on which said first outer electrode is formed.

11. The device according to claim 10, wherein one of said plurality of piezoelectric members which is placed between said third outer electrode and said inner electrode nearest thereto is not polarized.

12. The device according to claim 11, wherein said third outer electrode is formed at a position corresponding to a node of a driving vibration mode of said piezoelectric transformer device.

13. The device according to claim 10, wherein said plurality of inner electrodes are alternately connected to each other through at least two columnar conductors included in said first region, thereby constituting two inner electrode groups.

14. The device according to claim 13, wherein said at least two columnar conductors are formed at a position corresponding to a node of a driving vibration mode of said piezoelectric transformer device.

15. The device according to claim 14, wherein said inner electrodes are included in said piezoelectric transformer device.

16. The device according to claim 10, wherein said plurality of inner electrodes essentially consists of an Ag—Pd mixture containing 20 to 80 wt % of Pd, and has a thickness of 1 to 5 µm.

17. The device according to claim 16, wherein said columnar conductor essentially consists of an Ag—Pd mixture containing 20 to 80 wt % of Pd, and has a diameter of not more than 200 µm.

18. The device according to claim 1, wherein said first and second outer electrodes are only exposed on surfaces of said piezoelectric transformer device, and said plurality of first and second inner electrodes are included in said piezoelectric transformer device.

\* \* \* \* \*

UNITED STATES PATENT AND TRADEMARK OFFICE
CERTIFICATE OF CORRECTION

PATENT NO. : 6,172,447 B1
DATED : January 9, 2001
INVENTOR(S) : Katsuyuki Ishikawa, et al.

It is certified that error appears in the above-identified patent and that said Letters Patent is hereby corrected as shown below:

Last Priority Application is corrected as follows:

[30]   Foreign Application Priority Data

June 5, 1997   [JP]............................   9-148232

Second Foreign Patent Document is corrected as follows:

[56]   References Cited

FOREIGN PATENT DOCUMENTS

61-216493  4/1986   (JP) ......................310/363

Column 15,
Line 23, delete "aright-angled" and insert -- a right-angled --

Column 17,
Line 54, delete "50a'" and insert -- 56a' --

Column 22,
Line 8, delete "tacked" and insert -- stacked --.

Signed and Sealed this

Thirtieth Day of October, 2001

Attest:

NICHOLAS P. GODICI
*Attesting Officer*   *Acting Director of the United States Patent and Trademark Office*